(12) United States Patent
Komposch et al.

(10) Patent No.: US 11,257,740 B2
(45) Date of Patent: Feb. 22, 2022

(54) DEVICE CARRIER CONFIGURED FOR INTERCONNECTS, A PACKAGE IMPLEMENTING A DEVICE CARRIER HAVING INTERCONNECTS, AND PROCESSES OF MAKING THE SAME

(71) Applicant: Cree, Inc., Durham, NC (US)

(72) Inventors: Alexander Komposch, Morgan Hill, CA (US); Simon Ward, Morgan Hill, CA (US); Madhu Chidurala, Los Altos, CA (US)

(73) Assignee: WOLFSPEED, INC., Durham, NC (US)

( * ) Notice: Subject to any disclaimer, the term of this patent is extended or adjusted under 35 U.S.C. 154(b) by 79 days.

(21) Appl. No.: 16/797,290

(22) Filed: Feb. 21, 2020

(65) Prior Publication Data
US 2021/0265249 A1     Aug. 26, 2021

(51) Int. Cl.
*H01L 23/498* (2006.01)
*H01L 23/66* (2006.01)

(52) U.S. Cl.
CPC ........ *H01L 23/49811* (2013.01); *H01L 23/66* (2013.01); *H01L 2223/6611* (2013.01); *H01L 2223/6644* (2013.01)

(58) Field of Classification Search
CPC ............... H01L 23/49811; H01L 23/66; H01L 2223/6611; H01L 2223/6644
USPC ......................................................... 257/773
See application file for complete search history.

(56) References Cited

U.S. PATENT DOCUMENTS

| | | |
|---|---|---|
| 2012/0104427 A1 | 5/2012 | Chan et al. |
| 2013/0341656 A1 | 12/2013 | Chan et al. |
| 2014/0332941 A1 | 11/2014 | Viswanathan et al. |
| 2015/0249021 A1 | 9/2015 | Sanchez et al. |
| 2017/0287820 A1 | 10/2017 | Ahlers et al. |
| 2017/0373645 A1* | 12/2017 | Jang ...................... H03F 1/0294 |
| 2018/0114741 A1* | 4/2018 | Gagne ............... H01L 23/49827 |
| 2018/0175802 A1 | 6/2018 | Wu et al. |

OTHER PUBLICATIONS

International Search Report from PCT/US2021/017393 as prepared by the ISA/US; dated Apr. 23, 2021.

* cited by examiner

*Primary Examiner* — Elias Ullah
(74) *Attorney, Agent, or Firm* — BakerHostetler

(57) ABSTRACT

A device includes: a surface mount device carrier configured to be mounted to a metal submount of a transistor package, said surface mount device carrier includes an insulating substrate includes a top surface and a bottom surface and a first pad and a second pad arranged on a top surface of said surface mount device carrier; at least one surface mount device includes a first terminal and a second terminal, said first terminal of said surface mount device mounted to said first pad and said second terminal mounted to said second pad; and at least one of the first terminal and the second terminal being configured to be isolated from the metal submount by said insulating substrate, where at least one of the first pad and the second pad are configured as wire bond pads.

27 Claims, 28 Drawing Sheets

DEVICE CARRIER CONFIGURED FOR INTERCONNECTS, A PACKAGE IMPLEMENTING A DEVICE CARRIER HAVING INTERCONNECTS, AND PROCESSES OF MAKING THE SAME

FIELD OF THE DISCLOSURE

The disclosure relates to a device carrier configured for interconnects. The disclosure further relates to a package implementing a device carrier having interconnects. The disclosure further relates to a Radio frequency (RF) package implementing a Radio frequency (RF) device with a device carrier having interconnects. The disclosure further relates to a Radio frequency (RF) power amplifier transistor package implementing an RF device with a device carrier having interconnects. The disclosure further relates to a process of making a device carrier configured for interconnects. The disclosure further relates to a process of making a package implementing a device carrier having interconnects. The disclosure further relates to a process of making an RF package implementing an RF device with a device carrier having interconnects. The disclosure further relates to a process of making a Radio frequency (RF) power amplifier transistor package implementing an RF device with a device carrier having interconnects.

BACKGROUND OF THE DISCLOSURE

Radio frequency (RF) power amplifier transistor products use high-quality Q capacitors in close proximity to the transistor die to achieve higher video bandwidth for the transistors. Silicon based capacitors (trench CAPs or similar capacitors) are being used as they can be attached onto the heat sink right next to the semiconductor transistor die. However, silicon-based capacitors are expensive and provide limited capacitance. Such silicon-based capacitors use trenches or vias to increase its Q but are limited to the nF range in capacitance. This results in the need for a greater number of silicon-based capacitors to provide a desired capacitance and thereby further driving up costs. Additionally, the greater number of silicon-based capacitors needed increases the cost of manufacturing associated with die attach, increases the amount of wire bonding as well as increasing the complexity of manufacturing, which lowers the yield.

Surface mount device (SMD) ceramic capacitors are cheap, have a high Q and provide increased capacitance (in the pF range) compared to the silicon based capacitors (in the nF range). These surface mount devices are intended to be mounted directly to traces or contacts on circuit boards. Surface mount devices are not compatible with typical RF transistor packages in that the surface mount devices cannot be mounted on the metal heatsinks typically used in RF packages. Surface mount device (SMD) capacitors have both terminals on their bottom surface—which will short out when mounted on a metal flange (heat sink) of typical RF transistor packages. Additionally, the surface mount devices (SMDs) cannot be connected using the wire bonds typically used in RF transistor packages.

Accordingly, what is needed is a RF product that can implement a device carrier that can utilize various component configurations to reduce package cost, reduce package manufacturing cost, reduce manufacturing complexity, and/or the like.

SUMMARY OF THE DISCLOSURE

The disclosure relates to a surface mount device (SMD) carrier that enables the use of any and all types of surface mount devices (SMDs), such as ceramic capacitors, oscillators, and the like, in RF transistor packages using wire bonds and/or metal submounts, thereby reducing costs without sacrificing performance. In accordance with certain aspects of the disclosure, an RF power package includes a package support; at least one device carrier, the at least one device carrier including at least one device, a substrate configured to support the at least one device, the substrate including at least one first terminal, the at least one first terminal is arranged on the upper surface of the carrier, the at least one device being arranged on the substrate and connected to the at least one first terminal, the substrate includes one of the following: a printed circuit board (PCB) component, a ceramic component, a glass component, a low temperature co-fired ceramic (LTCC) component, a high temperature co-fired ceramic (HTCC) component, and a thick film substrate component, at least one interconnect pad, the at least one interconnect pad being connected to the at least one second terminal, the at least one device being arranged on the substrate and connected to the at least one second terminal. The at least one device carrier also includes where the at least one device is configured to connect to at least one secondary device by one or more interconnects through the at least one interconnect pad; where the at least one device includes at least one of the following: a surface mount device (SMD) capacitor, a surface mount device (SMD) ceramic capacitor, a surface mount device (SMD) oscillator, a surface mount device (SMD) inductor, a surface mount device (SMD) resistor, a surface mount device (SMD) power divider, a surface mount device (SMD) power splitter, a surface mount device (SMD) amplifier, a surface mount device (SMD) balanced amplifier, or a surface mount device (SMD) combiner. The at least one device carrier also includes where the substrate is configured to be electrically connected to a package support of an RF package. The at least one device carrier also includes where the at least one device is configured to be electrically connected to the package support of the RF package through the at least one first terminal.

One aspect includes an RF transistor package that includes a metal submount; a transistor die mounted to said metal submount; a surface mount device carrier mounted to said metal submount, said surface mount device carrier includes an insulating substrate includes a top surface and a bottom surface and a first pad and a second pad arranged on a top surface of said surface mount device carrier; at least one surface mount device includes a first terminal and a second terminal, said first terminal of said surface mount device mounted to said first pad and said second terminal mounted to said second pad; at least one of the first terminal and the second terminal being configured to be isolated from the metal submount by said insulating substrate; and at least one wire lead bonded to the at least one of the first pad and the second pad.

One aspect includes a device that includes a surface mount device carrier configured to be mounted to a metal submount of a transistor package, said surface mount device carrier includes an insulating substrate includes a top surface and a bottom surface and a first pad and a second pad arranged on a top surface of said surface mount device carrier; at least one surface mount device includes a first terminal and a second terminal, said first terminal of said surface mount device mounted to said first pad and said second terminal mounted to said second pad; and at least one of the first terminal and the second terminal being configured to be isolated from the metal submount by said insulating substrate, where at least one of the first pad and the second pad are configured as wire bond pads.

One aspect includes a process for implementing an RF transistor package that includes providing a metal submount; mounting a transistor die to said metal submount; mounting a surface mount device carrier to said metal submount, said surface mount device carrier includes an insulating substrate includes a top surface and a bottom surface and a first pad and a second pad arranged on a top surface of said surface mount device carrier; providing a first terminal and a second terminal on a surface mount device; mounting said first terminal of said surface mount device to said first pad and said second terminal of said surface mount device to said second pad; configuring at least one of the first terminal and the second terminal to be isolated from the metal submount by said insulating substrate; and bonding at least one wire lead to the at least one of the first pad and the second pad.

One aspect includes a process for implementing device that includes configuring a surface mount device carrier to be mounted to a metal submount of a transistor package; configuring the surface mount device carrier with an insulating substrate includes a top surface and a bottom surface and a first pad and a second pad arranged on a top surface of said surface mount device carrier; configuring at least one surface mount device with a first terminal and a second terminal; mounting said first terminal of said surface mount device to said first pad and said second terminal of said surface mount device to said second pad; and configuring at least one of the first terminal and the second terminal to be isolated from the metal submount by said insulating substrate, where at least one of the first pad and the second pad are configured as wire bond pads.

One general aspect includes an RF power package that includes a package support; at least one device carrier, the at least one device carrier including at least one device, a substrate configured to support the at least one device, the substrate including at least one first terminal arranged on an upper surface of the substrate, the at least one device being arranged on the substrate and connected to the at least one first terminal, the at least one device is configured to be electrically connected to a package support of the RF power package through the at least one first terminal, at least one interconnect pad, the at least one interconnect pad being connected to at least one second terminal, and the at least one device being arranged on the substrate and connected to the at least one second terminal, at least one secondary device, the at least one secondary device including a secondary device interconnect pad, the at least one device being configured to connect to the at least one secondary device by one or more interconnects through the at least one interconnect pad to the secondary device interconnect pad, where the at least one device includes at least one of the following: a surface mount device (SMD) capacitor, a surface mount device (SMD) oscillator, a surface mount device (SMD) ceramic capacitor, a surface mount device (SMD) inductor, a surface mount device (SMD) resistor, a surface mount device (SMD) power divider, a surface mount device (SMD) power splitter, a surface mount device (SMD) amplifier, a surface mount device (SMD) balanced amplifier, or a surface mount device (SMD) combiner; and where the substrate is configured to be mounted on an upper surface of the package support by at least one of the following: an adhesive, soldering, sintering, eutectic bonding, or ultrasonically welding.

In an embodiment, the disclosure is directed to an RF package having a metal flange, a metal leadframe, a base, or the like as described herein. The metal flange implementations may have a ceramic lid; and the metal leadframe implementations may be encapsulated with mold compound. The RF package may house RF devices such as a GaN based HEMT die, a silicon-based LDMOS transistor die, and/or the like as described herein. These RF devices may include matching networks. The prior art RF packages used expensive silicon-based capacitors that were wire bonded to the RF devices such as dies by input and/or output leads. In aspects of the disclosure, the disclosure utilizes less-expensive ceramic-based surface mount devices (SMDs). More specifically, the disclosure utilizes less-expensive ceramic-based surface mount devices (SMDs) that may be mounted directly to traces on PCBs, not using wire bonds as is used with the capacitors in typical RF packages, to replace the more expensive silicon-based capacitors. In various aspects, the disclosure is directed to mounting the surface mount discrete device(s) (SMDs) onto a submount, which may be mounted on the metal flange, the metal leadframe, the base, or the like. The submount may be wire bonded or the like to the RF devices such as dies by input and/or output leads of the RF package, which may be metal based.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
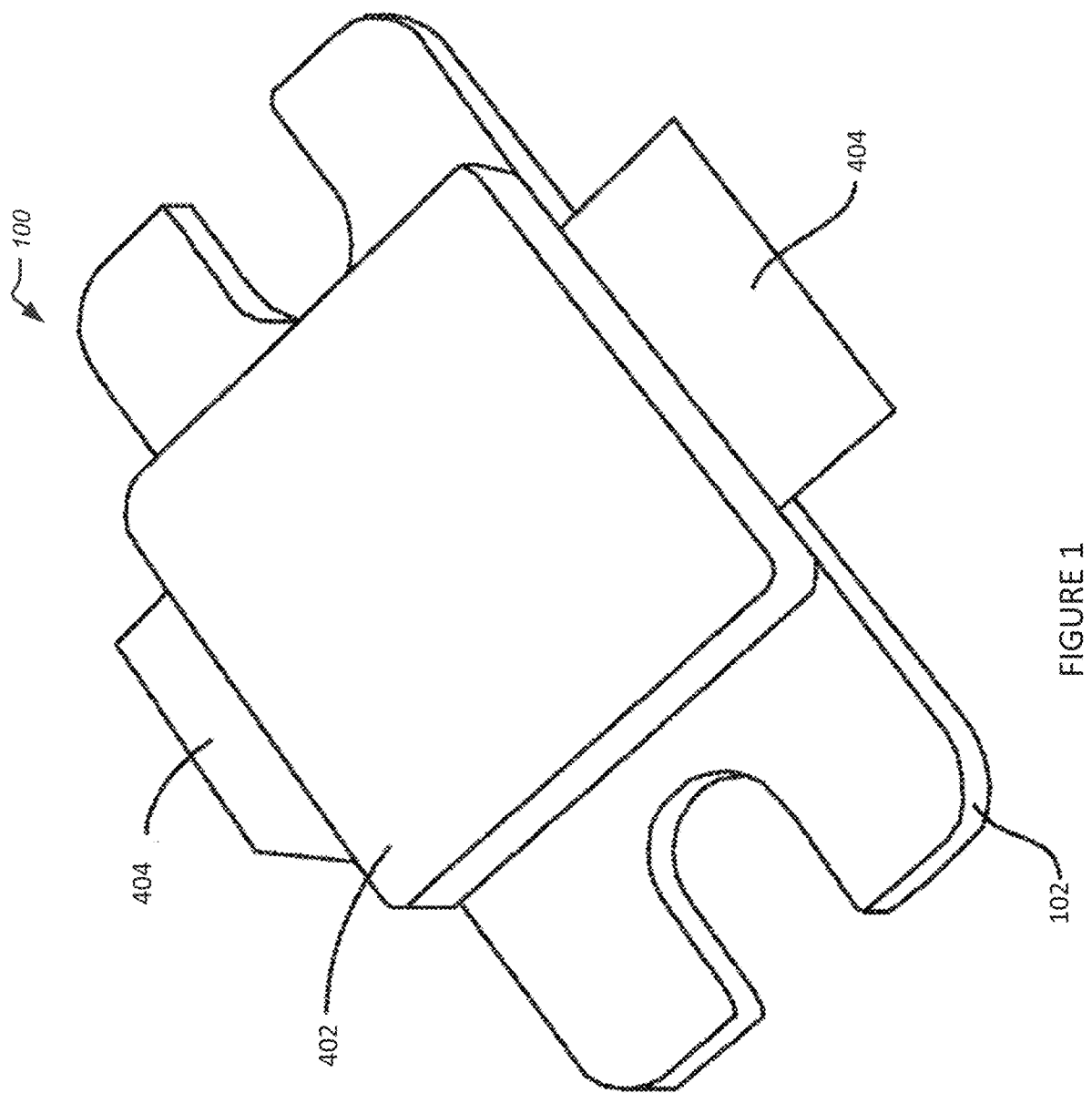
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms " " and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a perspective view of a package according to the disclosure.

Figure 2:
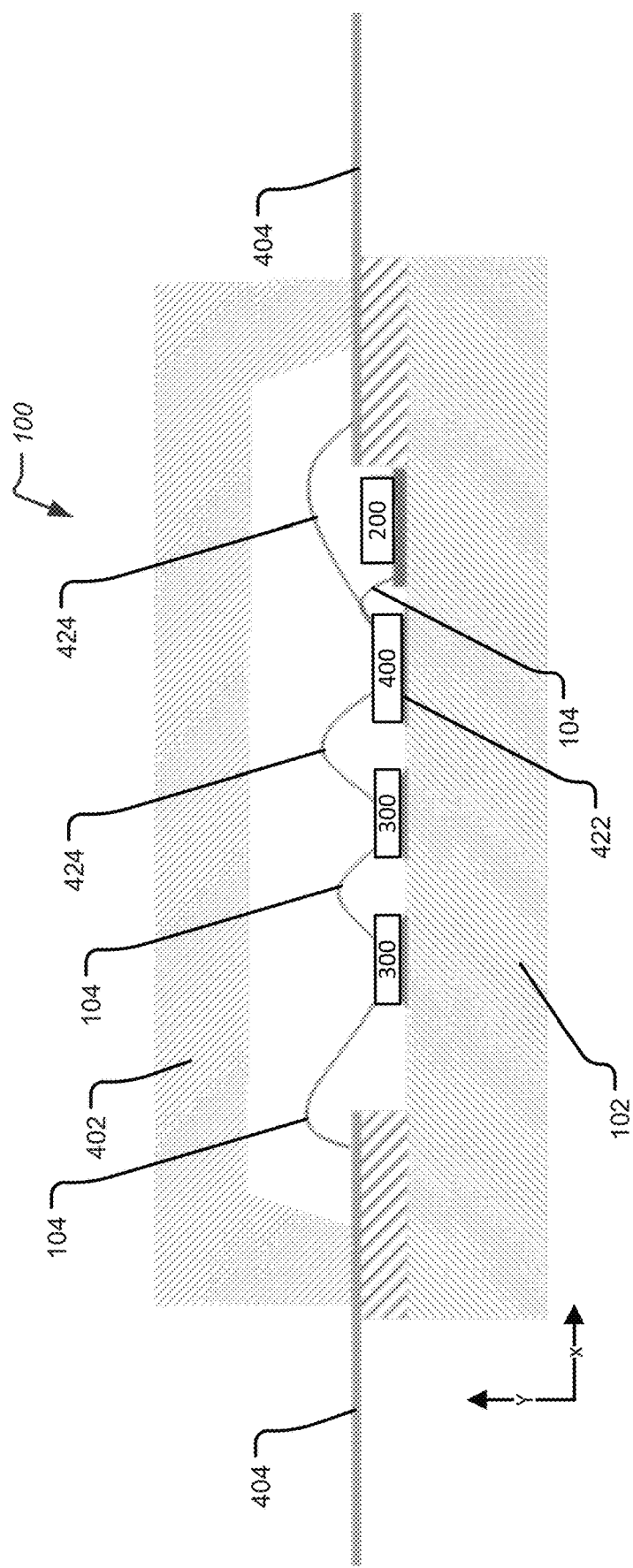
FIG. 2 illustrates a cross-sectional view of the package according to FIG. 1.

FIG. 2 illustrates a cross-sectional view of the package according to FIG. 1.

In particular, FIG. 1 and FIG. 2 show an exemplary implementation of a package 100 that may include any one or more other features, components, arrangements, and the like as described herein. In particular, FIG. 1 and FIG. 2 show the package 100 that may be implemented as a RF package, a RF amplifier package, a RF power amplifier package, a Radio frequency (RF) power transistor package, a Radio frequency (RF) power amplifier transistor package, and/or the like as described herein. The package 100 may include one or more semiconductor devices 400, at least one surface mount device carrier 200, and the at least one secondary device 300. The at least one surface mount device carrier 200 and/or the at least one secondary device 300 may be implemented as RF devices as described herein. The at least one surface mount device carrier 200 and/or the at least one secondary device 300 may be implement matching networks, harmonic termination circuitry, integrated passive devices (IPD), capacitors, resistors, inductors, and/or the like.

The one or more semiconductor devices 400 may be a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration and/or the like.

The package 100 may be implemented to include an open cavity configuration suitable for use with the at least one surface mount device carrier 200 and the at least one secondary device 300 of the disclosure. In particular, the open cavity configuration may utilize an open cavity package design. In some aspects, the open cavity configuration may include a lid or other enclosure for protecting interconnects, circuit components, the at least one surface mount device carrier 200, the at least one secondary device 300, the one or more semiconductor devices 400, and/or the like. The package 100 may include a ceramic body 402 and one or more metal contacts 404.

Inside the package 100, the one or more semiconductor devices 400 may be attached to a support 102 via a die attach material 422. One or more bond wires 424 may couple the one or more semiconductor devices 400 to a first one of the one or more metal contacts 404 and a second one of the one or more metal contacts 404. Additionally, inside the package 100, the at least one surface mount device carrier 200 and the at least one secondary device 300 may be arranged on the support 102 as described herein with one or more interconnects 104 shown in an exemplary configuration that may connect between the package 100, the at least one surface mount device carrier 200, the at least one secondary device 300, and/or the one or more semiconductor devices 400. The support 102 may dissipate the heat generated by the one or more semiconductor devices 400, the at least one surface mount device carrier 200, and the at least one secondary device 300, while simultaneously isolating and protecting the one or more semiconductor devices 400, the at least one surface mount device carrier 200, and the at least one secondary device 300 from the outside environment.

The package 100 may include a support 102. The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Figure 4:
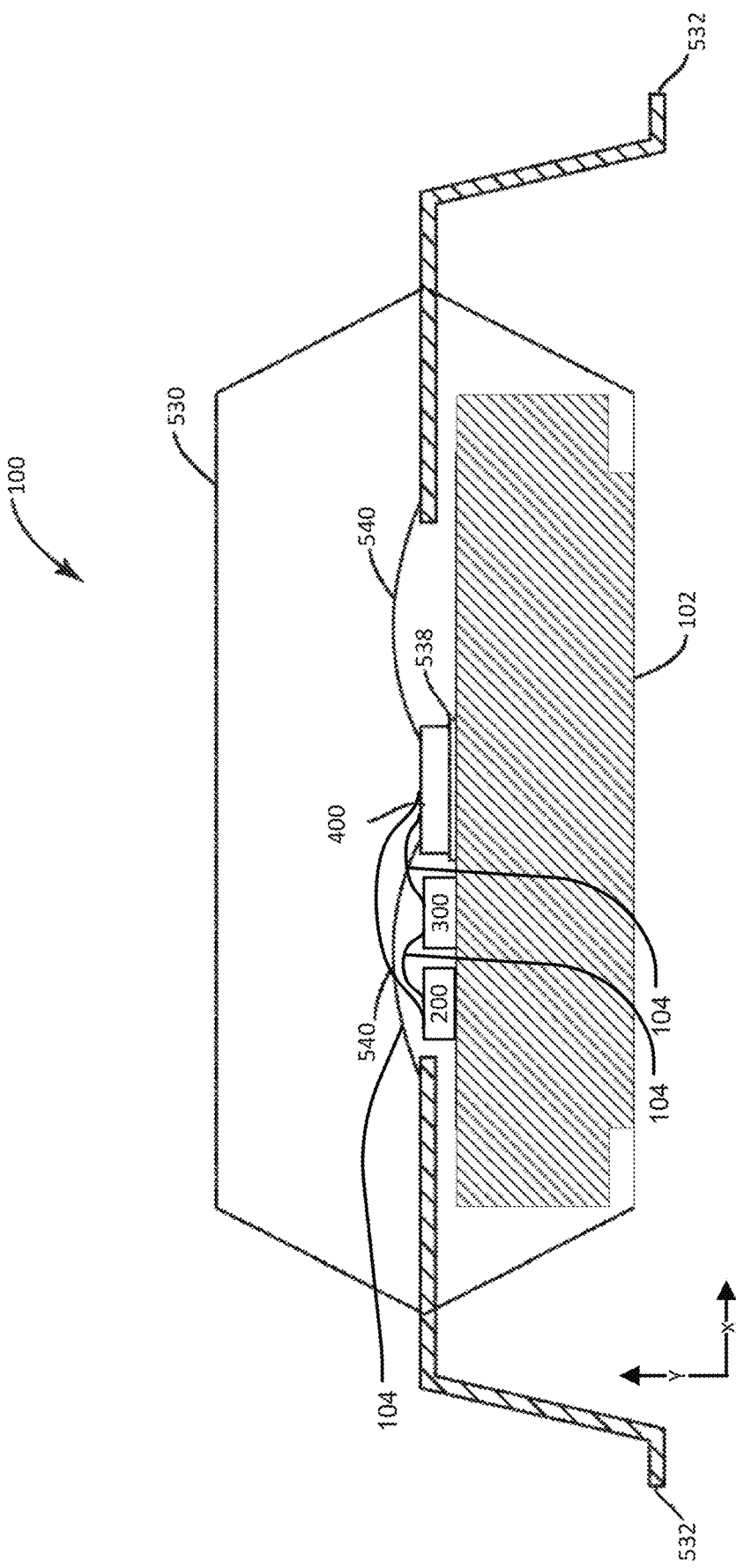
FIG. 4 illustrates a cross-sectional view of the package according to FIG. 3.

Additionally, the package 100 may include one or more transistors having one or more transistor dies attached directly or indirectly to the substrate 102 as illustrated in FIG. 2 and FIG. 4. The one or more transistors having one or more transistor dies may include one or more laterally-diffused metal-oxide semiconductor (LDMOS) transistors, GaN based transistors, Metal Semiconductor Field-Effect transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMT), Wide Band Gap (WBG) transistors, and/or the like.

Figure 3:
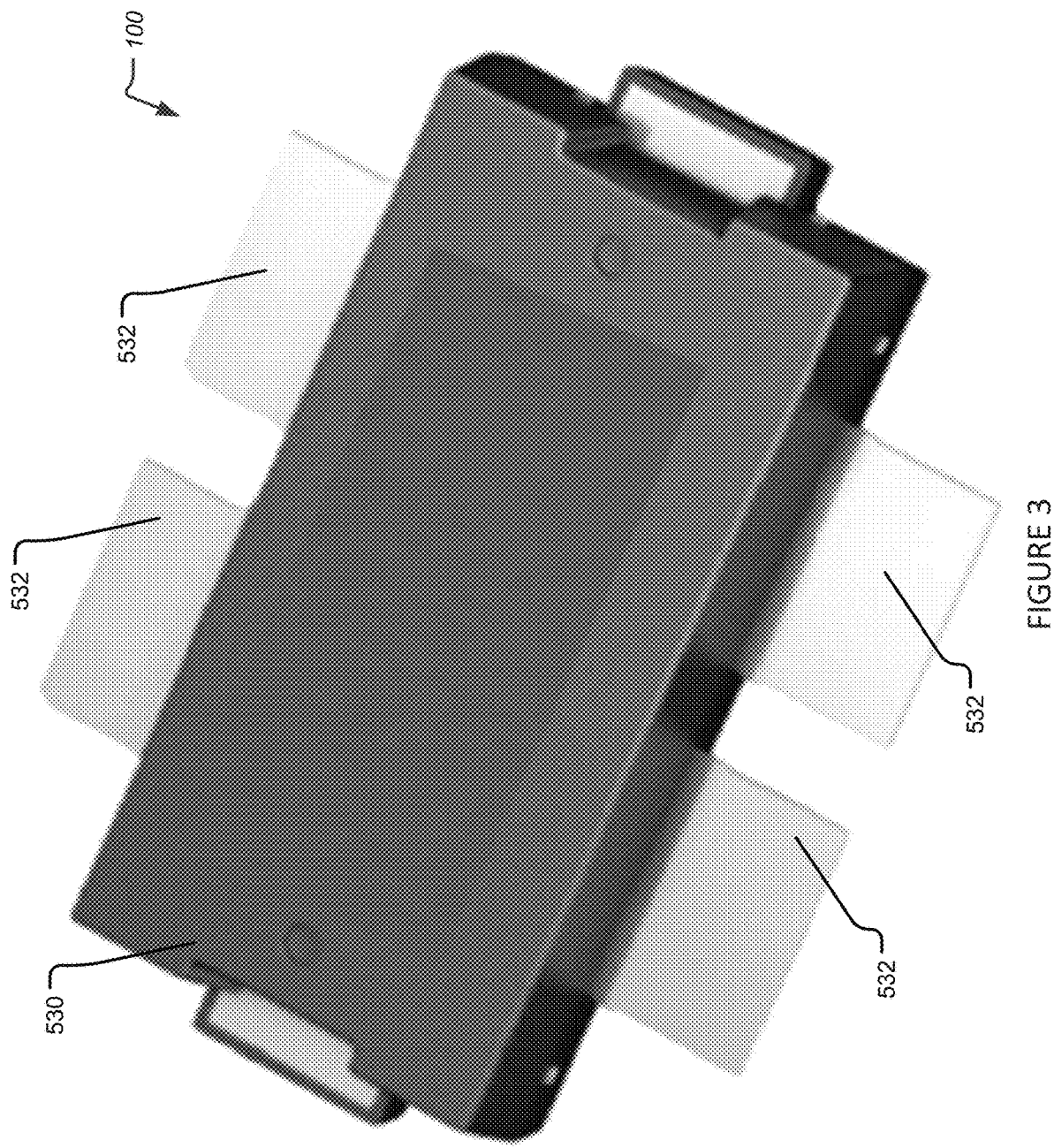
FIG. 3 illustrates a perspective view of a package according to the disclosure.

FIG. 3 illustrates a perspective view of a package according to the disclosure.

FIG. 4 illustrates a cross-sectional view of the package according to FIG. 3.

In particular, FIG. 3 and FIG. 4 show another exemplary implementation of the package 100 that may include any one or more other features, components, arrangements, and the like as described herein. In particular, FIG. 3 and FIG. 4 show the package 100 may be implemented as a RF package, a RF amplifier package, a RF power amplifier package, a Radio frequency (RF) power transistor package, a Radio frequency (RF) power amplifier transistor package, and/or the like as described herein. The package 100 may include the one or more semiconductor devices 400, the at least one surface mount device carrier 200, and the at least one secondary device 300.

Additionally, inside the package 100, the at least one surface mount device carrier 200 and the at least one secondary device 300 may be arranged on the support 102 as described herein with the one or more interconnects 104 shown in an exemplary configuration. The package 100 may include an over-mold 530, one or more input/output pins 532, and the support 102. The over-mold 530 may substantially surround the one or more semiconductor devices 400, which are mounted on the support 102 using a die attach material 538. The over-mold 533 may be formed of a plastic or a plastic polymer compound, which may be injection molded around the support 102, the one or more semiconductor devices 400, the at least one surface mount device carrier 200, and the at least one secondary device 300 thereby providing protection from the outside environment. The one or more semiconductor devices 400 may be coupled to the one or ore input/output pins 532 via bond wires 540.

In one aspect, the over-mold configuration may substantially surround the one or more semiconductor devices 400, the at least one surface mount device carrier 200, and the at least one secondary device 300. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the at least one surface mount device carrier 200, and the at least one secondary device 300, thereby providing protection for the at least one surface mount device carrier 200, the at least one secondary device 300, the one or more semiconductor devices 400, and other components of the package 100 from the outside environment.

Figure 5:
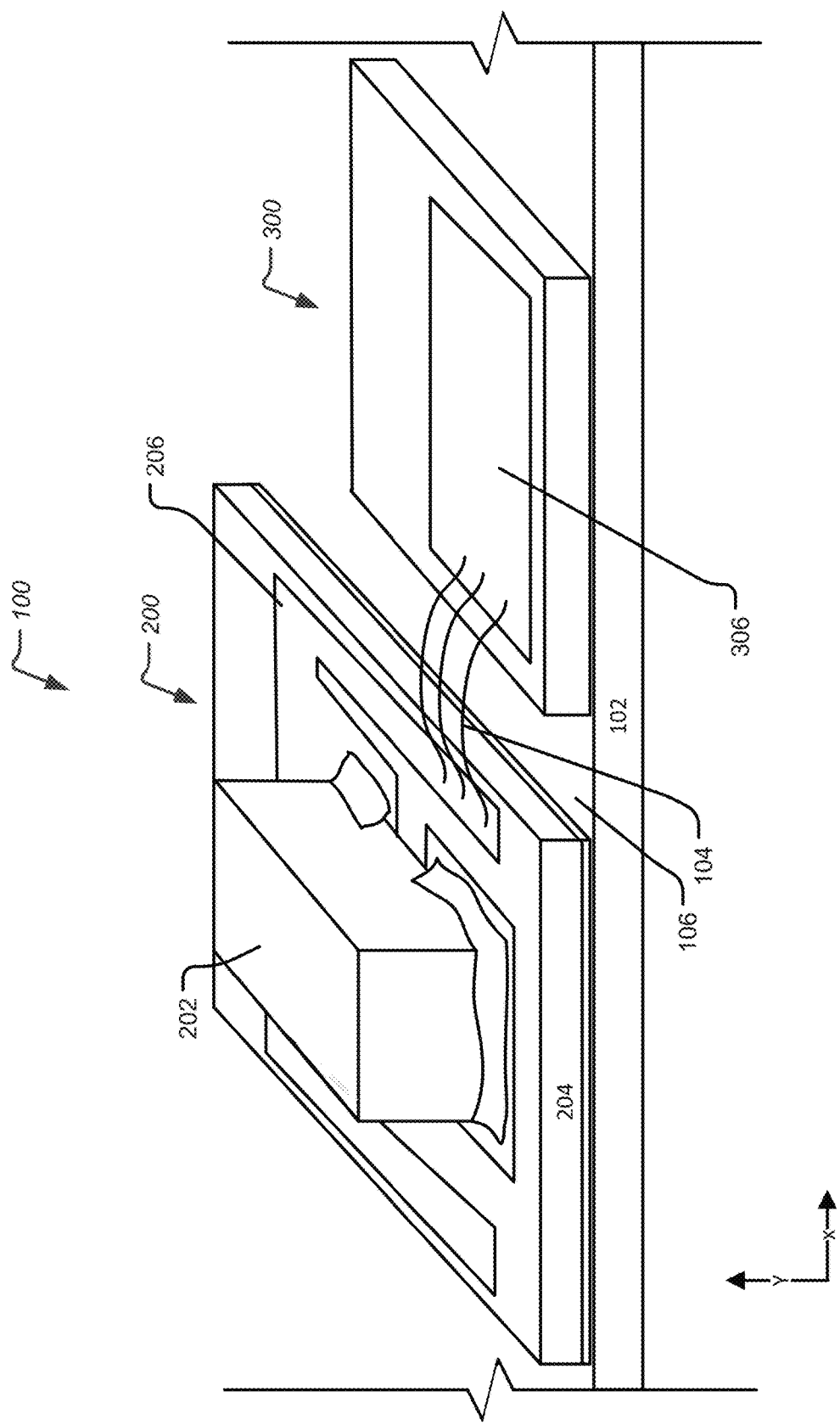
FIG. 5 illustrates a perspective view of a device carrier according to the disclosure implemented in a package that includes at least one secondary device.

FIG. 5 illustrates a perspective view of a device carrier according to the disclosure implemented in a package that includes at least one secondary device.

Figure 6:
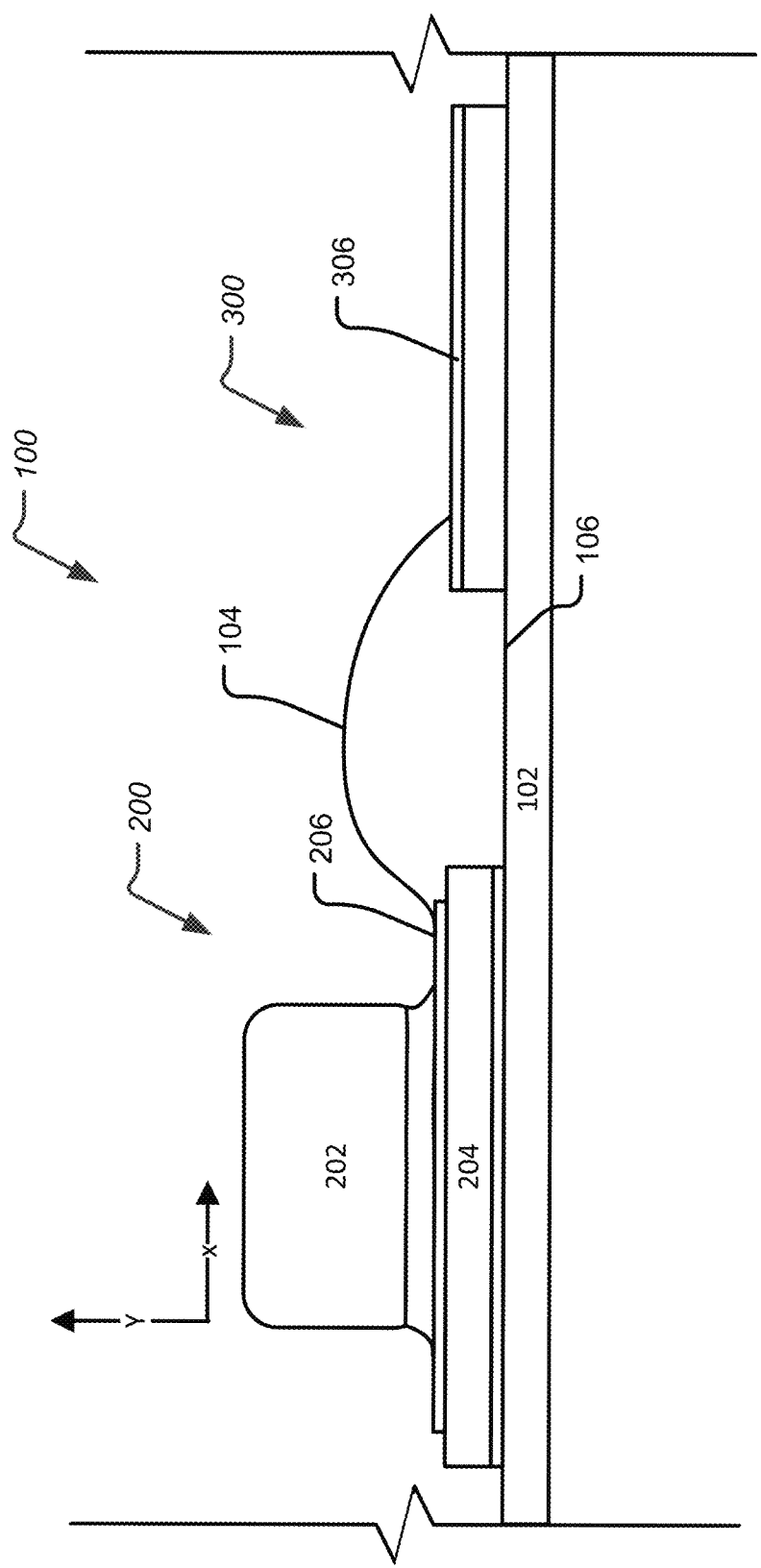
FIG. 6 illustrates an end view of a device carrier according to FIG. 5.

FIG. 6 illustrates an end view of a device carrier according to the disclosure implemented in a package that includes at least one secondary device according to FIG. 5.

In particular, FIG. 5 and FIG. 6 illustrate the package 100 and the at least one surface mount device carrier 200 that implements at least one device 202. The at least one surface mount device carrier 200 may be implemented in the package 100. The at least one surface mount device carrier 200 may be implemented as an RF device and the at least one surface mount device carrier 200 may connect the at least one device 202 to the package 100, to at least one secondary device 300, to the one or more semiconductor devices 400, and/or the like. The at least one surface mount device carrier 200 may be implemented as a device carrier. The at least one surface mount device carrier 200 may be implemented as a submount.

In an embodiment, the package 100 may be implemented as an RF package having the support 102 that may be implemented as a metal submount that may include a metal flange, a metal leadframe, a base, or the like as described herein. The metal flange implementations may have a ceramic lid; and the metal leadframe implementations may be encapsulated with mold compound. Other configurations are described herein. The package 100 may be implemented as an RF package and may house RF devices. The RF devices may be configured and implemented in the at least one surface mount device carrier 200 and/or the at least one secondary device 300. In particular, the RF devices may be configured and implemented in the at least one surface mount device carrier 200 and/or the at least one secondary device 300 and may include a GaN based HEMT die, a silicon-based LDMOS transistor die, and/or the like as described herein. The RF devices may include matching networks, harmonic termination circuitry, integrated passive devices (IPD), and the like.

In particular, the RF devices may be configured and implemented in the at least one surface mount device carrier 200 and/or the at least one secondary device 300 as matching networks, harmonic termination circuitry, integrated passive devices (IPD), and the like and may utilize less-expensive ceramic-based surface mount devices (SMDs) that are typically mounted directly to traces on the at least one surface mount device carrier 200 to replace the more expensive silicon-based capacitors. In various aspects, the disclosure is directed to mounting the surface mount discrete device(s) (SMDs) onto the at least one surface mount device carrier 200 implemented as a submount, which may be mounted on the support 102 such as the metal flange, the metal leadframe, the base, or the like. The submount may be wire bonded or the like to the RF devices such as the dies by input and/or output leads of the RF package, which may be metal based.

Although the Figures illustrate the at least one surface mount device carrier 200 implementing a single one of the at least one device 202, the at least one surface mount device carrier 200 may implement a plurality of the at least one device 202. Likewise, although the Figures illustrate the package 100 implementing a single one of the at least one surface mount device carrier 200, the package 100 may implement a plurality of the at least one surface mount device carrier 200.

FIG. 5 and FIG. 6 further illustrate that the at least one surface mount device carrier 200 may connect the at least one device 202 to the at least one secondary device 300 by the one or more interconnects 104. More specifically, the at least one surface mount device carrier 200 may include an interconnect pad 206; and the at least one secondary device 300 may include an interconnect pad 306. The interconnect pad 206 may be an interconnect bond pad; and the interconnect pad 306 may be an interconnect bond pad. The one or more interconnects 104 may connect to the interconnect pad 206 and the interconnect pad 306. Other types of connections for the at least one surface mount device carrier 200 and/or the at least one secondary device 300 are contemplated as well.

The one or more interconnects 104 may be implemented as one or more wires, leads, vias, edge platings, circuit traces, tracks, clips, and/or the like. In one aspect, the one or more interconnects 104 may utilize the same type of connection. In one aspect, the one or more interconnects 104 may utilize different types of connections.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal.

The one or more interconnects 104 may connect to the interconnect pad 206 by an adhesive, soldering, sintering, eutectic bonding, thermal compression bonding, ultrasonic bonding/welding, a clip component, and/or the like as described herein. The one or more interconnects 104 may connect to the interconnect pad 306 by an adhesive, soldering, sintering, eutectic bonding, thermal compression bonding, ultrasonic bonding/welding, a clip component, and/or the like as described herein. In one aspect, the connections may utilize the same type of connection. In one aspect, the connections may utilize different types of connections.

The package 100 may be implemented to include an open cavity configuration, an over-mold configuration, and/or the like. In this regard, the package 100 may be implemented to include an open cavity configuration suitable for use with the at least one surface mount device carrier 200 and the at least one secondary device 300 of the disclosure. In particular, the open cavity configuration may utilize an open cavity package design. In some aspects, the open cavity configuration may include a lid or other enclosure for protecting interconnects, circuit components, the at least one surface mount device carrier 200, the at least one secondary device 300, and/or the like.

Alternatively, the package 100 may be implemented to include an over-mold configuration suitable for use with the at least one surface mount device carrier 200 and the at least one secondary device 300 of the disclosure. In one aspect, the over-mold configuration may substantially surround the at least one surface mount device carrier 200 and the at least one secondary device 300. The over-mold configuration may be formed of a plastic, a mold compound, a plastic compound, a polymer, a polymer compound, a plastic polymer compound, and/or the like. The over-mold configuration may be injection or compression molded around the at least one surface mount device carrier 200 and the at least one secondary device 300, thereby providing protection for the at least one surface mount device carrier 200, the at least one secondary device 300, and other components of the package 100 from the outside environment.

The at least one surface mount device carrier 200 may include a substrate 204. The substrate 204 may be a printed circuit board (PCB) component, a ceramic component, a glass component, a low temperature co-fired ceramic (LTCC) component, a high temperature co-fired ceramic (HTCC) component, a thick film substrate component, and/or the like. In one or more aspects, the substrate 204 may include Teflon and/or hydrocarbon materials. In one or more aspects, the substrate 204 may include Teflon and/or hydrocarbon materials mixed with ceramic fillers. In one or more aspects, the substrate 204 may include Teflon and/or hydrocarbon materials mixed with ceramic fillers implemented as radio frequency (RF) materials.

The at least one device 202 may be one or more of a surface mount device (SMD) component, a surface mount device (SMD) capacitor, a ceramic capacitor, a surface mount device (SMD) oscillator, a surface mount device (SMD) ceramic capacitor, an inductor, a surface mount device (SMD) inductor, a resistor, a surface mount device (SMD) resistor, a power divider, a surface mount device (SMD) power divider, a power splitter, a surface mount device (SMD) power splitter, an amplifier, a balanced amplifier, a surface mount device (SMD) amplifier, a surface mount device (SMD) balanced amplifier, a combiner, a surface mount device (SMD) combiner, and/or the like. The at least one device 202 may be implemented as a radio frequency device, a radio frequency circuit device, a radio frequency component device, or the like. The at least one device 202 may be implemented as a radio frequency device, a radio frequency circuit device, a radio frequency component device, or the like may be one or more of a surface mount device (SMD) radio frequency component, a surface mount device (SMD) radio frequency capacitor, a radio frequency ceramic capacitor, a surface mount device (SMD) oscillator, a surface mount device (SMD) radio frequency ceramic capacitor, a radio frequency inductor, a surface mount device (SMD) radio frequency inductor, a radio frequency resistor, a surface mount device (SMD) radio frequency resistor, a radio frequency power divider, a surface mount device (SMD) radio frequency power divider, a radio frequency power splitter, a surface mount device (SMD) radio frequency power splitter, a radio frequency amplifier, a balanced radio frequency amplifier, a surface mount device (SMD) radio frequency amplifier, a surface mount device (SMD) radio frequency balanced amplifier, a radio frequency combiner, a surface mount device (SMD) radio frequency combiner, and/or the like.

The package 100 may be implemented as an RF package and the at least one device 202 may be implemented as a radio frequency device may include, connect, support, or the like a transmitter, transmitter functions, a receiver, receiver functions, a transceiver, transceiver functions, matching network functions, harmonic termination circuitry, integrated passive devices (IPD), and the like. The at least one device 202 implemented as a radio frequency device may be configured to, may support, or the like transmitting a radio wave and modulating that wave to carry data with allowable transmitter power output, harmonics, and/or band edge requirements. The at least one device 202 implemented as a radio frequency device may be configured to, may support, or the like receiving a radio wave and demodulating the radio wave. The at least one device 202 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

In this regard, the at least one device 202 may include terminals arranged on a bottom surface. Accordingly, directly mounting a device such as the at least one device 202 to the support 102 of the package 100 would result in a short. For example, the at least one device 202 implemented as a surface mount device (SMD) component, such as a surface mount device (SMD) ceramic capacitor, may include one or more terminals arranged on a bottom surface of the surface mount device (SMD) component. Accordingly, mounting the at least one device 202 configured as a surface mount device (SMD) component to the support 102 of the package 100 would result in a short.

Accordingly, the disclosure utilizes the substrate 204 of the at least one surface mount device carrier 200 to support the at least one device 202. The substrate 204 may be mounted on an upper surface 106 of the support 102. The substrate 204 may be mounted on the upper surface 106 of the support 102 by an adhesive, soldering, sintering, eutectic bonding, ultrasonically welding, and/or the like as described herein. In one aspect, the substrate 204 may be directly mounted on the upper surface 106 of the support 102. In one aspect, the substrate 204 may be mounted on the upper surface 106 of the support 102 with intervening structures, components, and/or the like. The upper surface 106 of the support 102 may be parallel to an x-axis as illustrated in FIG. 5; and the substrate 204 may be arranged vertically above the support 102 along a y-axis as illustrated in FIG. 5. In one aspect, the substrate 204 may be at least partially insulating. More specifically, the substrate 204 may at least partially insulate the at least one device 202 from the support 102.

The at least one secondary device 300 may be mounted on the upper surface 106 of the support 102. The at least one secondary device 300 may be mounted on the upper surface 106 of the support 102 by an adhesive, soldering, sintering, eutectic bonding, ultrasonically welding, and/or the like. In one aspect, the at least one secondary device 300 may be directly mounted on the upper surface 106 of the support 102. In one aspect, the at least one secondary device 300 may be mounted on the upper surface 106 of the support 102 with intervening structures, components, and/or the like. The at least one secondary device 300 may be arranged vertically above the support 102 along the y-axis as illustrated in FIG. 5, The at least one secondary device 300 may be attached to the support 102 as described herein by an adhesive, soldering, sintering, eutectic bonding, ultrasonically welding, and/or the like. The at least one secondary device 300 may be a printed circuit board (PCB) component, a ceramic component, a glass component, a low temperature co-fired ceramic (LTCC) component, a high temperature co-fired ceramic (HTCC) component, a thick film substrate component, and/or the like.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MESFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support; or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support; or the like receiving a radio wave and demodulating the radio wave.

The at least one secondary device 300 may be an active device, a passive device; an integrated passive device (IPD), a transistor device, or the like. The at least one secondary device 300 may include any electrical component for any application. In this regard, the at least one secondary device 300 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device; an ultra-wideband device; a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The at least one secondary device 300 may be implemented as a radio frequency device, a radio frequency circuit, a radio frequency component, or the like. The at least one secondary device 300 implemented as a radio frequency device, a radio frequency circuit, a radio frequency component, or the like may include, connect, support, or the like a transmitter, transmitter functions, a receiver, receiver functions, a transceiver, transceiver functions, and the like. The at least one secondary device 300 implemented as a radio frequency device may be configured to, may support, or the like transmitting a radio wave and modulating that wave to carry data with allowable transmitter power output, harmonics, and/or band edge requirements. The at least one secondary device 300 implemented as a radio frequency device may be configured to, may support, or the like receiving a radio wave and demodulating the radio wave. The at least one secondary device 300 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

In one aspect, the at least one secondary device 300 may be a high-electron mobility transistor (HEW' In this regard, the HEMT may be Group III-Nitride based devices and such HEMTs may be implemented for high power Radio Frequency (RF) applications, for low frequency high power switching applications, as well as other applications. For example, the material properties of Group III-nitrides, such as GaN and its alloys, enable achievement of high voltage and high current, along with high RF gain and linearity for RF applications. A typical Group III-nitride HEMT relies on the formation of a two-dimensional electron gas (2DEG) at the interface between a higher band gap Group-III nitride (e.g., AlGaN) barrier layer and a lower band gap Group-Ill nitride material (e.g., GaN) buffer layer, where the smaller band gap material has a higher electron affinity. The 2DEG is an accumulation layer in the smaller band gap material and can contain a high electron concentration and high electron mobility.

Figure 7:
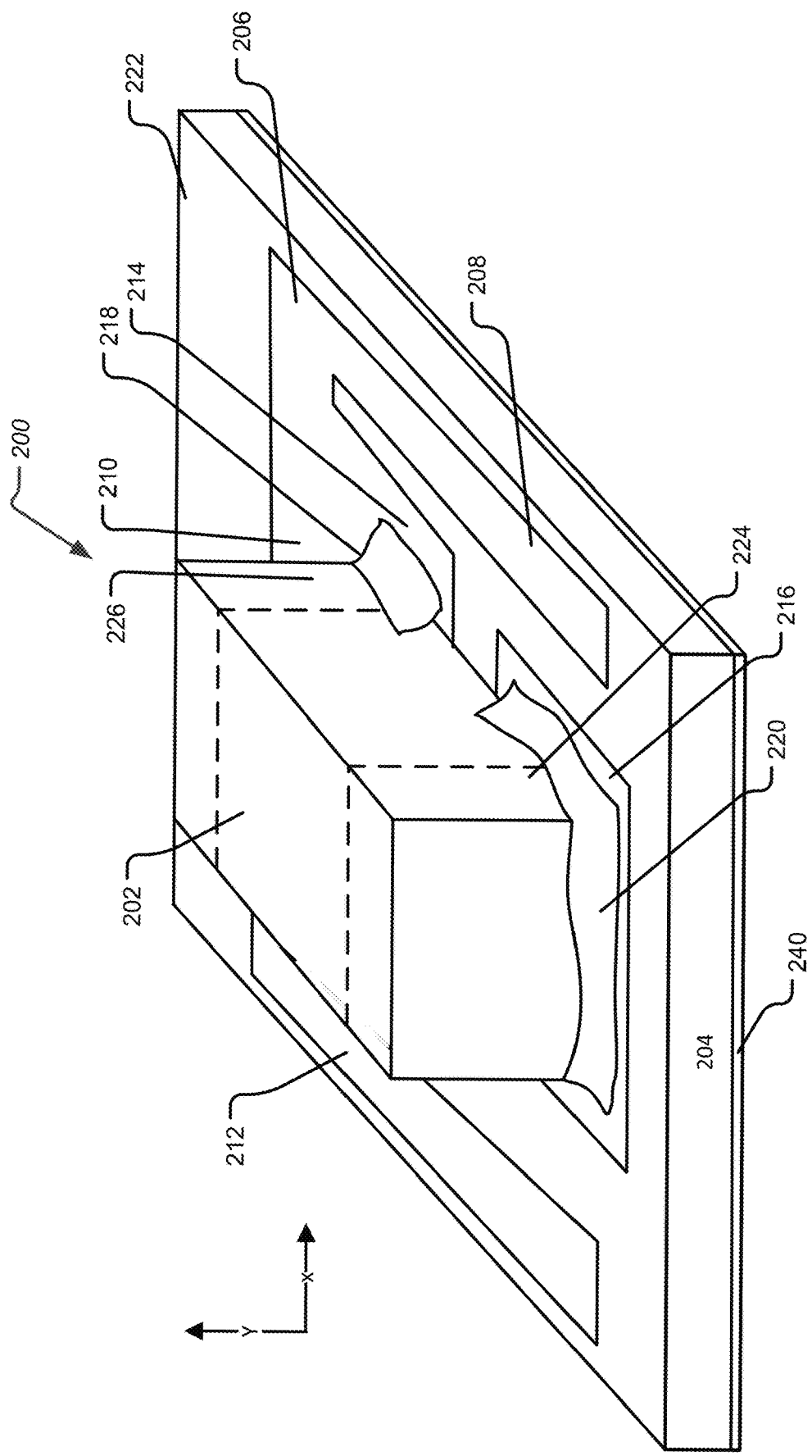
FIG. 7 illustrates a perspective view of a device carrier according to FIG. 5.

FIG. 7 illustrates a perspective view of a device carrier according to FIG. 5.

Figure 8:
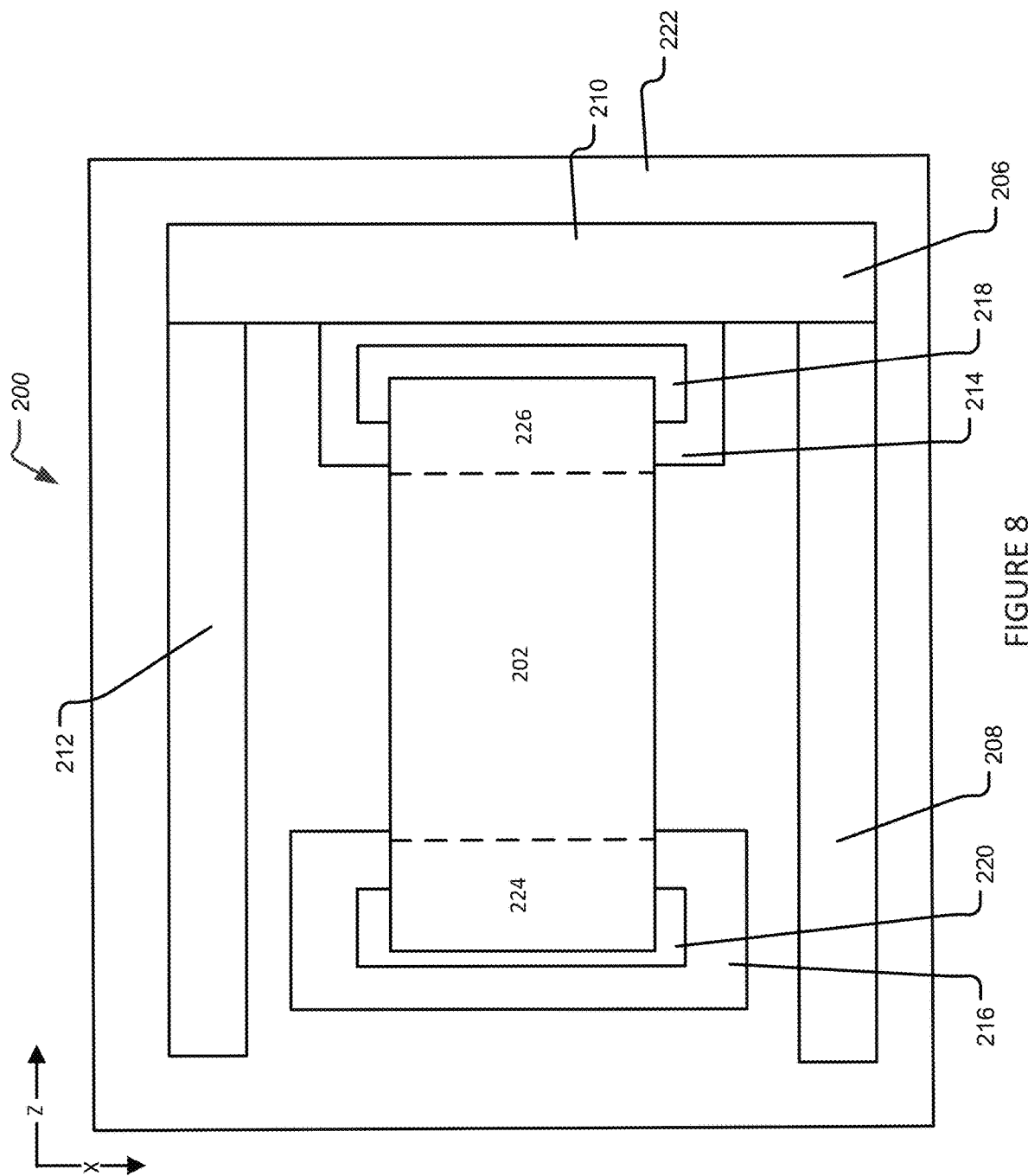
FIG. 8 illustrates a top view of a device carrier according to FIG. 5.

FIG. 8 illustrates a top view of a device carrier according to FIG. 5.

Figure 9:
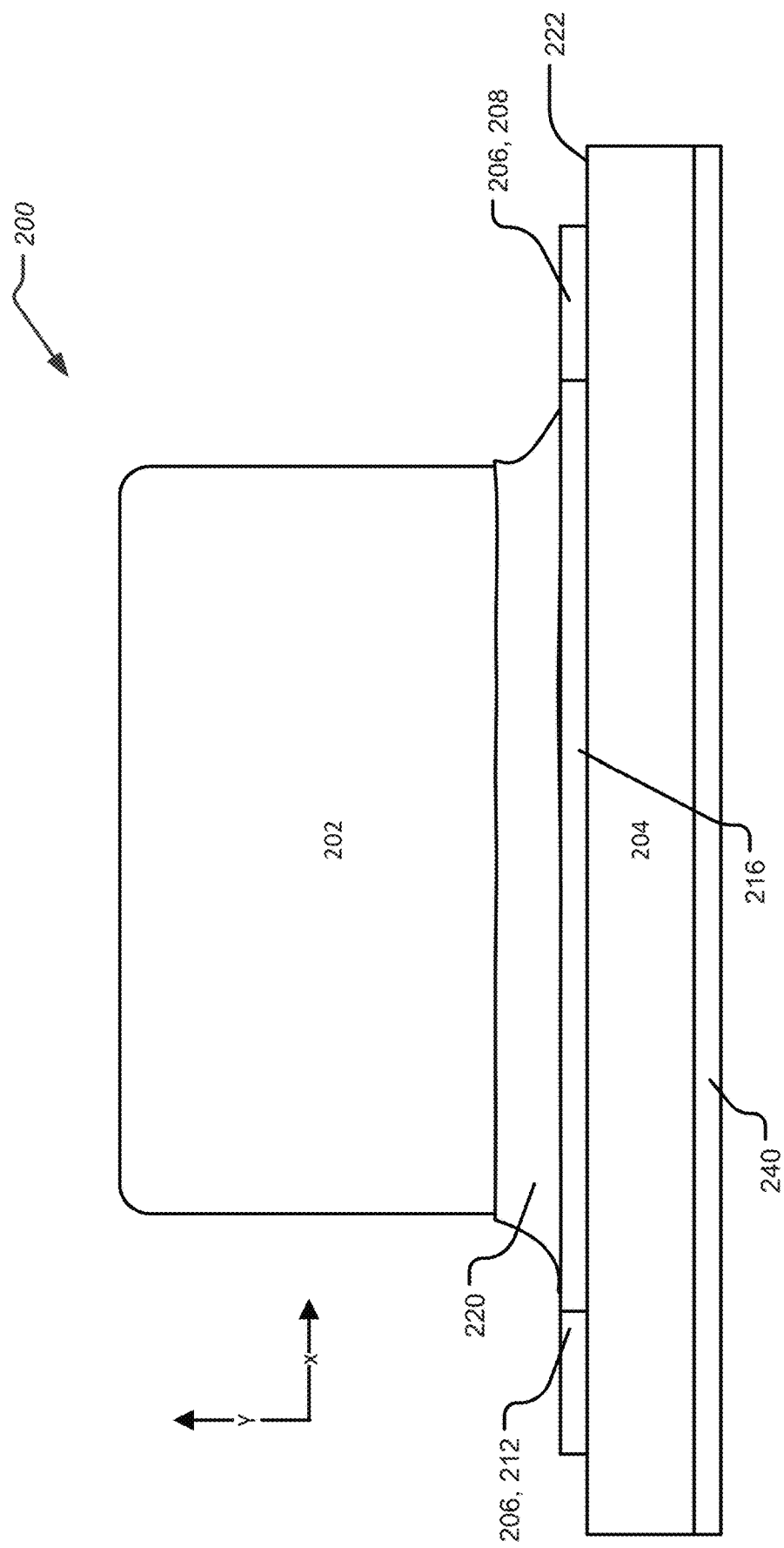
FIG. 9 illustrates an end view of a device carrier according to FIG. 5.

FIG. 9 illustrates an end view of a device carrier according to FIG. 5.

With reference to FIG. 7, FIG. 8, and FIG. 9, the substrate 204 may include an upper surface 222. The upper surface 222 may be located in a plane generally parallel to the x-axis or a plane generally parallel to the upper surface 106. The upper surface 222 may support the interconnect pad 206. The interconnect pad 206 may include a first bond pad area 208, a second bond pad area 210, and a third bond pad area 212. However, it is contemplated that the interconnect pad 206 may include any number of bond pad areas based on an application of the package 100, the at least one surface mount device carrier 200, the at least one secondary device 300, or the like. The interconnect pad 206, the first bond pad area 208, the second bond pad area 210, the third bond pad area 212, any other bond pad areas may be formed by a metal surface on the upper surface 222 of the substrate 204 and may comprise a metallic material such as copper, gold, nickel, palladium, silver, and the like, and combinations thereof. In this regard, generally may be defined to be within 0°-15° 0°-2°, 2°-4°, 4°-6°, 6°-8°, 8°-10°, 10°-12°, or 12°-15°.

The upper surface 222 may further include a first terminal bond pad 216. The first terminal bond pad 216 may be located in a plane generally parallel to the x-axis or a plane generally parallel to the upper surface 106. The first terminal bond pad 216 may connect to a first terminal 224 of the at least one device 202. In this regard, a first connection 220 may be formed between the first terminal bond pad 216 and the first terminal 224. The first connection 220 may include an adhesive, soldering, sintering, eutectic bonding, ultrasonically welding, and/or the like as described herein. The first terminal bond pad 216 may be formed by a metal surface on the upper surface 222 of the substrate 204 and may comprise a metallic material such as copper, gold, nickel, palladium, silver, and the like, and combinations thereof.

The upper surface 222 may further include a second terminal bond pad 214. The second terminal bond pad 214 may be located in a plane generally parallel to the x-axis or a plane generally parallel to the upper surface 106. The second terminal bond pad 214 may connect to a second terminal 226 of the at least one device 202. In this regard, a second connection 218 may be formed between the second terminal bond pad 214 and the second terminal 226. The second terminal bond pad 214 may be electrically connected in part to the interconnect pad 206. The second connection 218 may include an adhesive, soldering, sintering, eutectic bonding, ultrasonically welding, and/or the like as described herein. The second terminal bond pad 214 may be formed by a metal surface on the upper surface 222 of the substrate 204 and may comprise a metallic material such as copper, gold, nickel, palladium, silver, and the like, and combinations thereof. Additionally, the upper surface 222 of the substrate 204 may include additional terminals for the at least one device 202 as needed.

The at least one surface mount device carrier 200 may include a metallization layer 240 located on a lower surface of the substrate 204 opposite the upper surface 222. The metallization layer 240 may be located in a plane generally parallel to the x-axis or a plane generally parallel to the upper surface 106. In one aspect, the metallization layer 240 may be implemented as a full face metallic layer on the lower surface of the substrate 204 opposite the upper surface 222. Additionally or alternatively, the at least one surface mount device carrier 200 may be single-sided (one metallic layer), double-sided (two metallic layers on both sides of one substrate layer), or multi-layer (outer and inner layers of aluminum, copper, silver, gold, and/or the like, alternating with layers of substrate). The at least one surface mount device carrier 200 may include separate conducting lines, tracks, circuit traces, pads for connections, vias to pass connections between layers of aluminum, copper, silver, gold, and/or the like, and features such as solid conductive areas for EM shielding or other purposes.

Additionally or alternatively the at least one surface mount device carrier 200 may include conductors on different layers that may be connected with vias, which may be metallic plated holes, such as copper-plated holes, aluminum-plated holes, silver-plated holes, gold-plated holes, and/or the like, that may function as electrical tunnels through the insulating substrate. The at least one surface mount device carrier 200 may include "Through hole" components that may be mounted by their wire leads passing through the substrate 204 and soldered to traces on the other side. The at least one surface mount device carrier 200 may include "Surface mount" components that may be attached by their leads and/or terminals.

The at least one surface mount device carrier 200 and/or the metallization layer 240 may be manufactured utilizing one or more manufacturing techniques including print screening or dispensing for solder paste, print screening or dispensing for epoxy, silk screen printing processes, photo-engraving processes, print onto transparent film processes, photo mask processes, photo-sensitized board processes, laser resist ablation processes, milling processes, laser etching processes, and/or like processes. In one or more aspects, the at least one surface mount device carrier 200 may be a printed circuit board (PCB). In one or more aspects, the at least one surface mount device carrier 200 may be configured to mechanically support and electrically connect the at least one device 202 to the at least one secondary device 300 and other electronic components.

Figure 10:
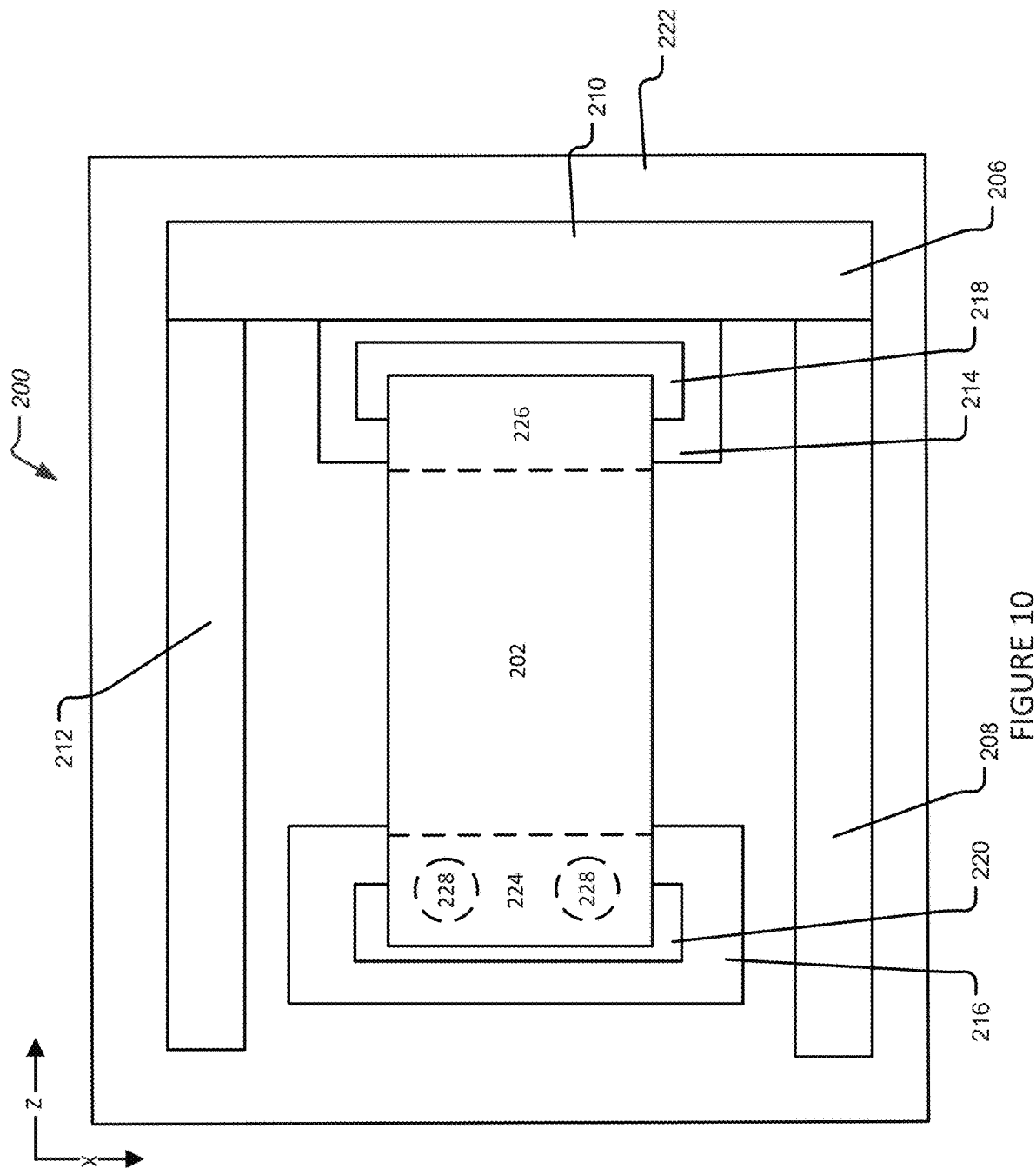
FIG. 10 illustrates a top view of a device carrier according to FIG. 7.

FIG. 10 illustrates a top view of a device carrier according to FIG. 7.

Figure 11:
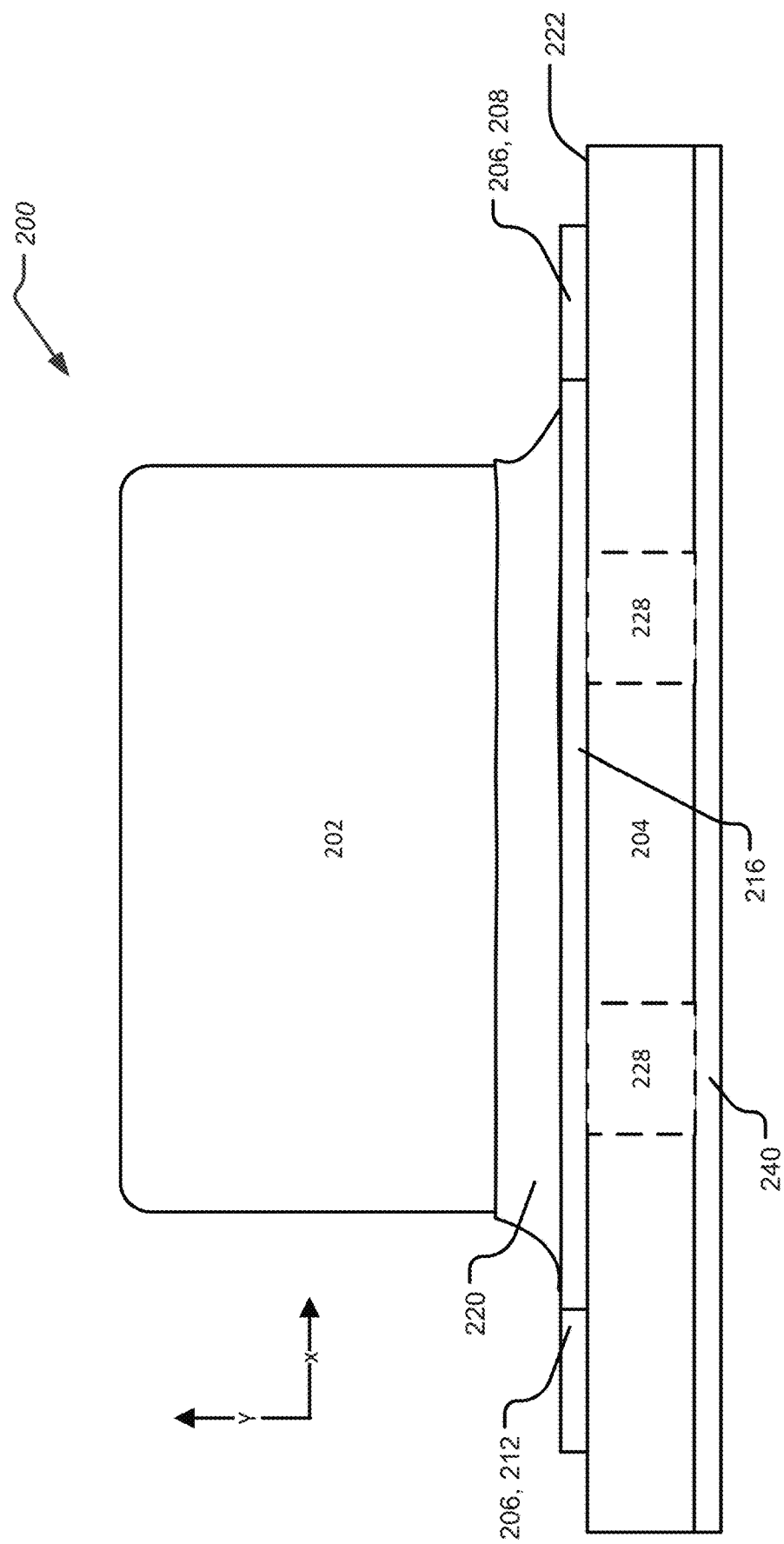
FIG. 11 illustrates an end view of a device carrier according to FIG. 10.

FIG. 11 illustrates an end view of a device carrier according to FIG. 10.

In particular, FIG. 10 and FIG. 11 illustrate the at least one surface mount device carrier 200 that may include any and all features, configurations, arrangements, implementations, aspects and/or the like as described herein. Additionally, FIG. 10 and FIG. 11 illustrate that the at least one surface mount device carrier 200 may include vias 228. The vias 228 may extend from the first terminal bond pad 216 to the metallization layer 240. Accordingly, the first terminal 224 of the at least one device 202 may connect through the first connection 220 to the first terminal bond pad 216 through the vias 228 at least to the metallization layer 240 to make an electrical connection and/or electrical contact with the support 102. The vias 228 may also extend through the metallization layer 240 to the support 102 to make an electrical connection and/or electrical contact with the support 102. In other aspects, the vias 228 may only be implemented as partial vias. The vias 228 may be metallic plated holes or metallic filled holes that may function as electrical tunnels through the substrate 204. The vias 228 may comprise a metallic material such as copper, gold, nickel, palladium, silver, and the like, and combinations thereof, Additionally, FIG. 10 and FIG. 11 illustrate that the at least one surface mount device carrier 200 may implement two of the vias 228. However, this is simply for ease of illustration. The at least one surface mount device carrier 200 may include 1-20 of the vias 228, 1-2 of the vias 228, 2-3 of the vias 228, 3-4 of the vias 228, 4-6 of the vias 228, 6-8 of the vias 228, 8-12 of the vias 228, 12-16 of the vias 228, or 16-20 of the vias 228. The vias 228 may have an axis that may be located in a plane generally perpendicular to the x-axis, a plane generally parallel to the x-axis, and/or a plane generally perpendicular to the upper surface 106.

Figure 12:
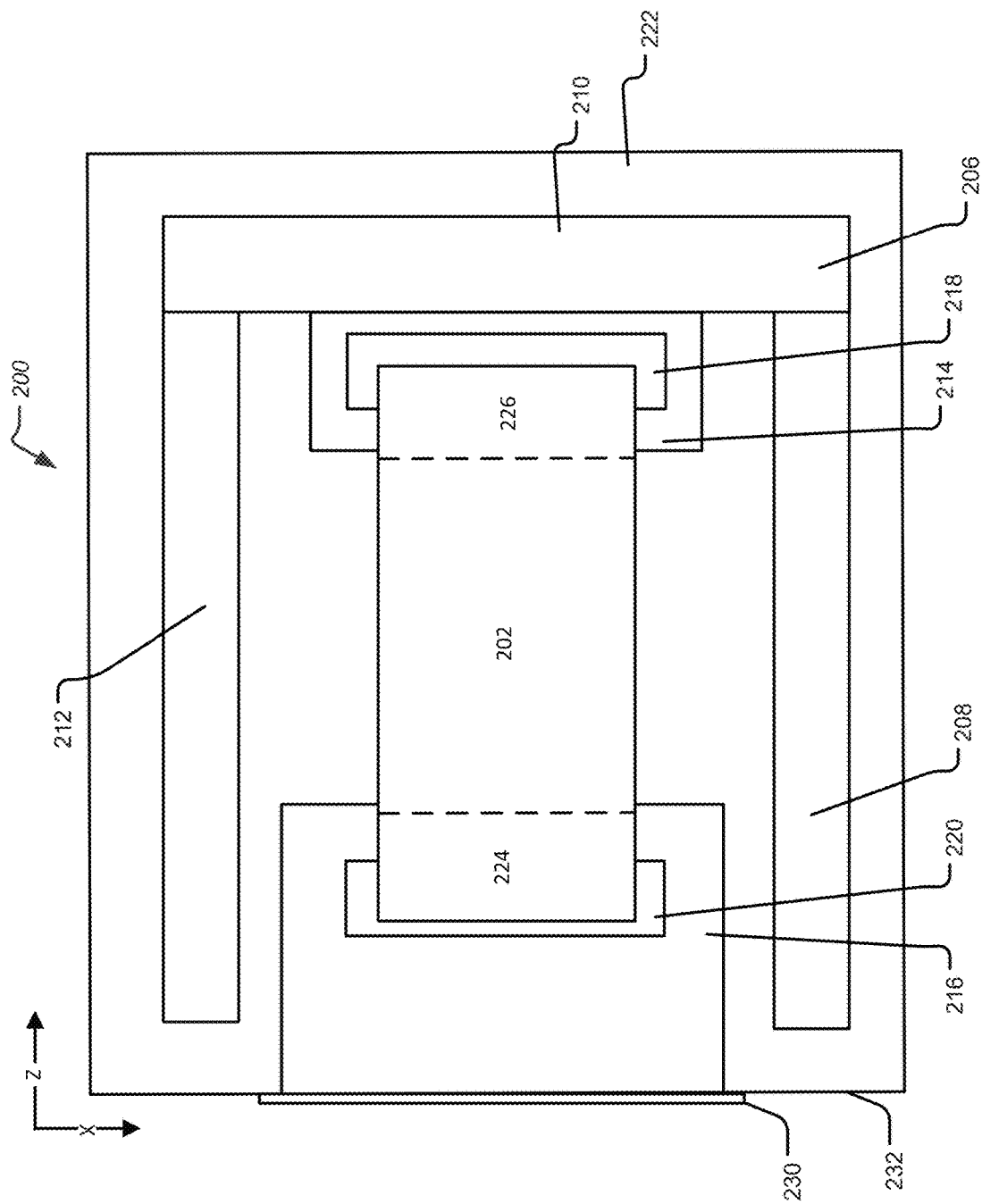
FIG. 12 illustrates a top view of a device carrier according to the disclosure.

FIG. 12 illustrates a top view of a device carrier according to the disclosure.

Figure 13:
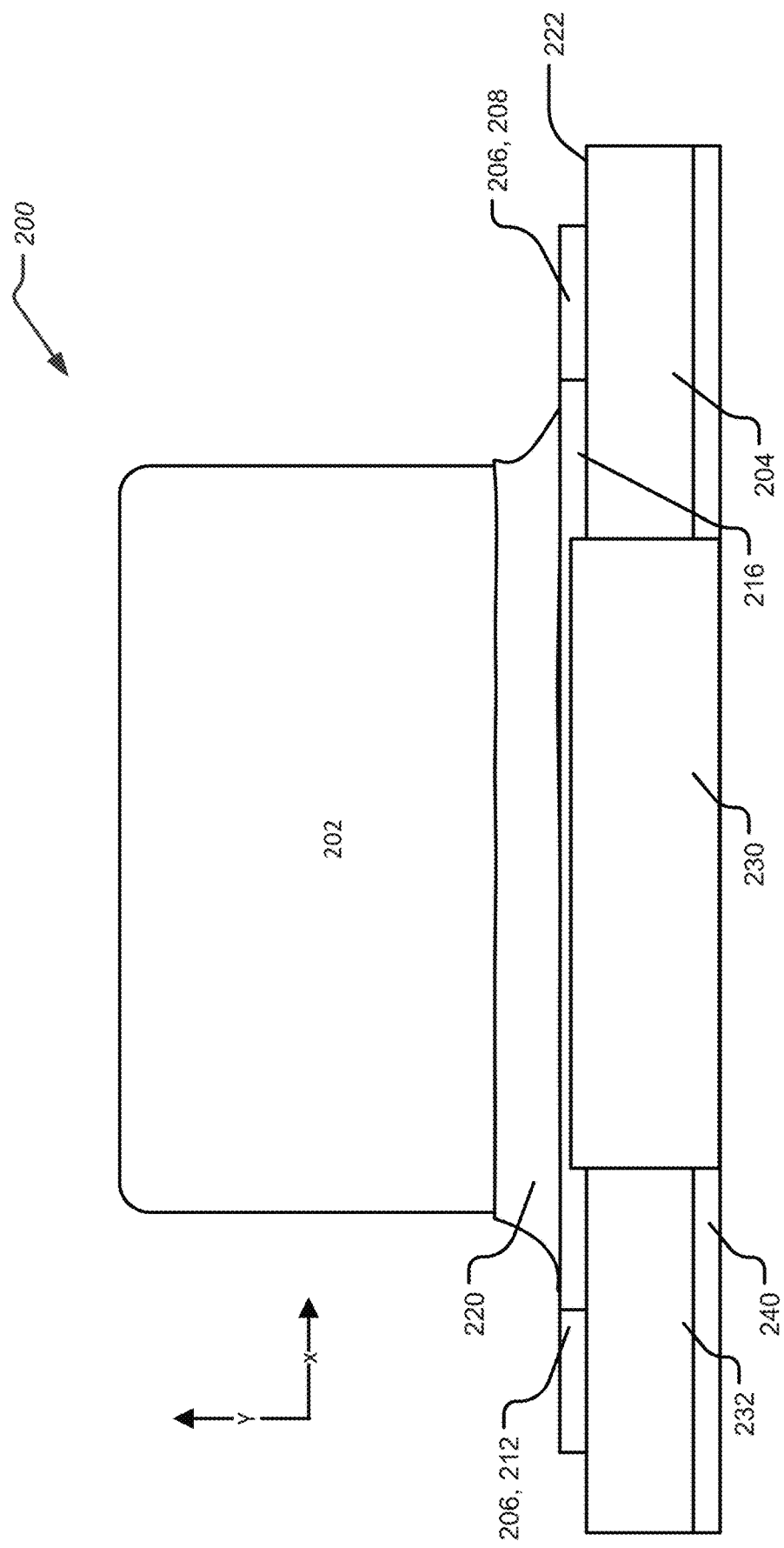
FIG. 13 illustrates an end view of a device carrier according to FIG. 12.

FIG. 13 illustrates an end view of a device carrier according to FIG. 12.

In particular, FIG. 12 and FIG. 13 illustrate the at least one surface mount device carrier 200 that may include any and all features, configurations, arrangements, implementations, aspects and/or the like as described herein. Additionally, FIG. 12 and FIG. 13 illustrate that the at least one surface mount device carrier 200 may include edge plating 230. The edge plating 230 may extend from the first terminal bond pad 216 to the metallization layer 240. In this regard, the first terminal bond pad 216 may extend to an edge 232 of the at least one device 202 to connect to the edge plating 230. The edge plating 230 may be located in a plane generally perpendicular to the x-axis or a plane generally perpendicular to the upper surface 106. Accordingly, the first terminal 224 of the at least one device 202 may connect through the first connection 220 to the first terminal bond pad 216 through the edge plating 230 at least to the metallization layer 240 to make an electrical connection and/or electrical contact with the support 102. The edge plating 230 may also extend to the metallization layer 240 to the support 102 to make an electrical connection and/or electrical contact with the support 102. The edge plating 230 may comprise a metallic material such as copper, gold, nickel, palladium, silver, and the like, and combinations thereof. In one or more aspects, the edge plating 230 include routing and plated constellation configurations and/or long-hole configurations also called castellation or edge plating. In one or more aspects, the edge plating 230 may further reduce cost in comparison to utilizing vias as vias may at times become plugged.

Additionally or alternatively, the at least one surface mount device carrier 200 may include one or more interconnects. The one or more interconnects may extend from the first terminal bond pad 216 to the support 102 to make an electrical connection and/or electrical contact with the support 102. The one or more interconnects may be implemented as one or more wires, leads, vias, edge platings, circuit traces, tracks, clips, and/or the like. In one aspect, the one or more interconnects may utilize the same type of connection. In one aspect, the one or more interconnects may utilize different types of connections. The one or more interconnects may utilize ball bonding, wedge bonding, compliant bonding, ribbon bonding, metal clip attach, and/or the like. In one aspect, the one or more interconnects may utilize the same type of connection. In one aspect, the one or more interconnects may utilize different types of connections. The one or more interconnects may include various metal materials including one or more of aluminum, copper, silver, gold, and/or the like. In one aspect, the one or more interconnects may utilize the same type of metal. In one aspect, the one or more interconnects may utilize different types of metal. The one or more interconnects may connect to the first terminal bond pad 216 by an adhesive, soldering, sintering, eutectic bonding, thermal compression bonding, ultrasonic bonding/welding, a clip component, and/or the like as described herein. The one or more interconnects may connect to the support 102 by an adhesive, soldering, sintering, eutectic bonding, thermal compression bonding, ultrasonic bonding/welding, a clip component, and/or the like as described herein.

Figure 14:
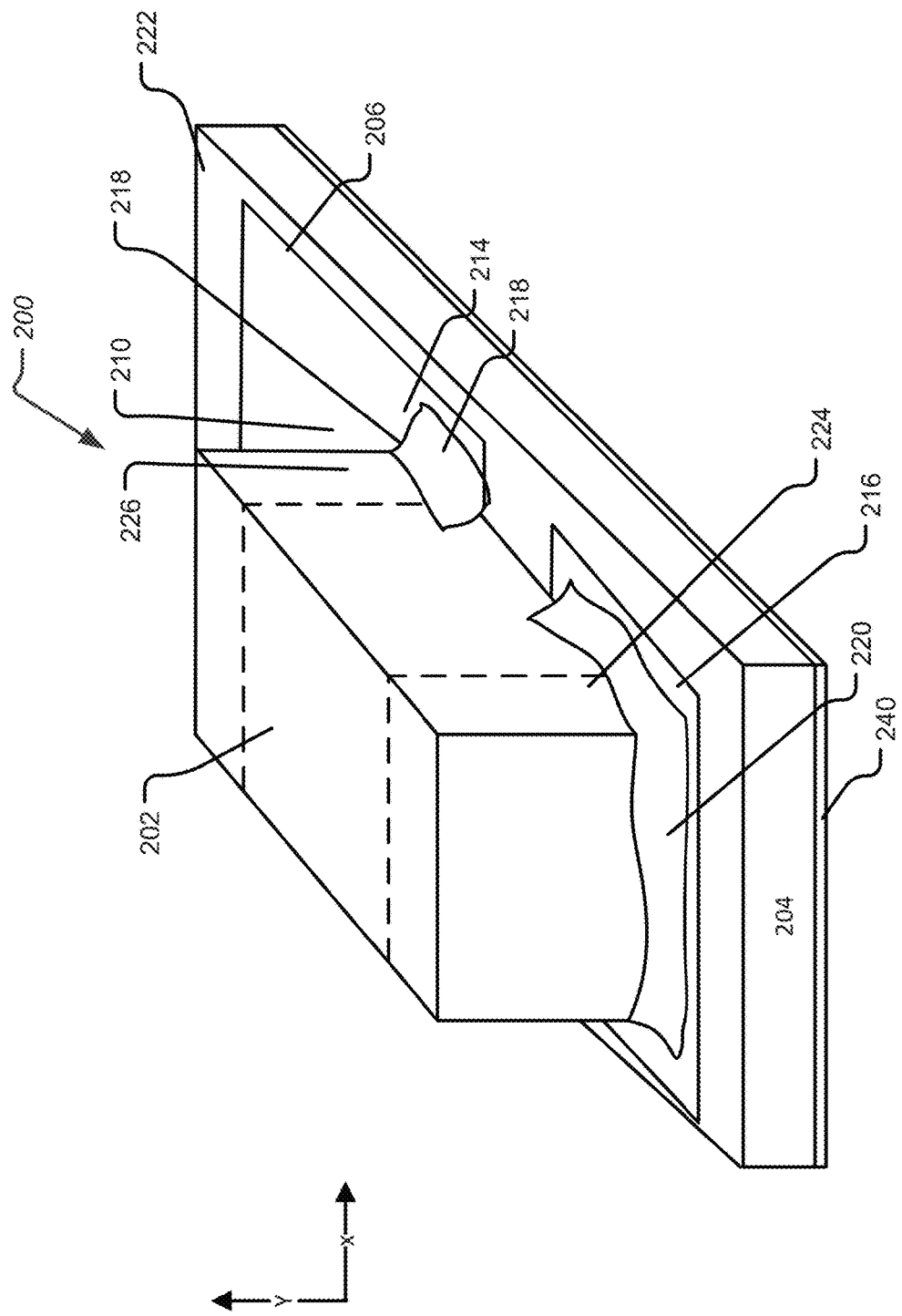
FIG. 14 illustrates a perspective view of a device carrier according to another aspect of the disclosure.

FIG. 14 illustrates a perspective view of a device carrier according to another aspect of the disclosure.

Figure 15:
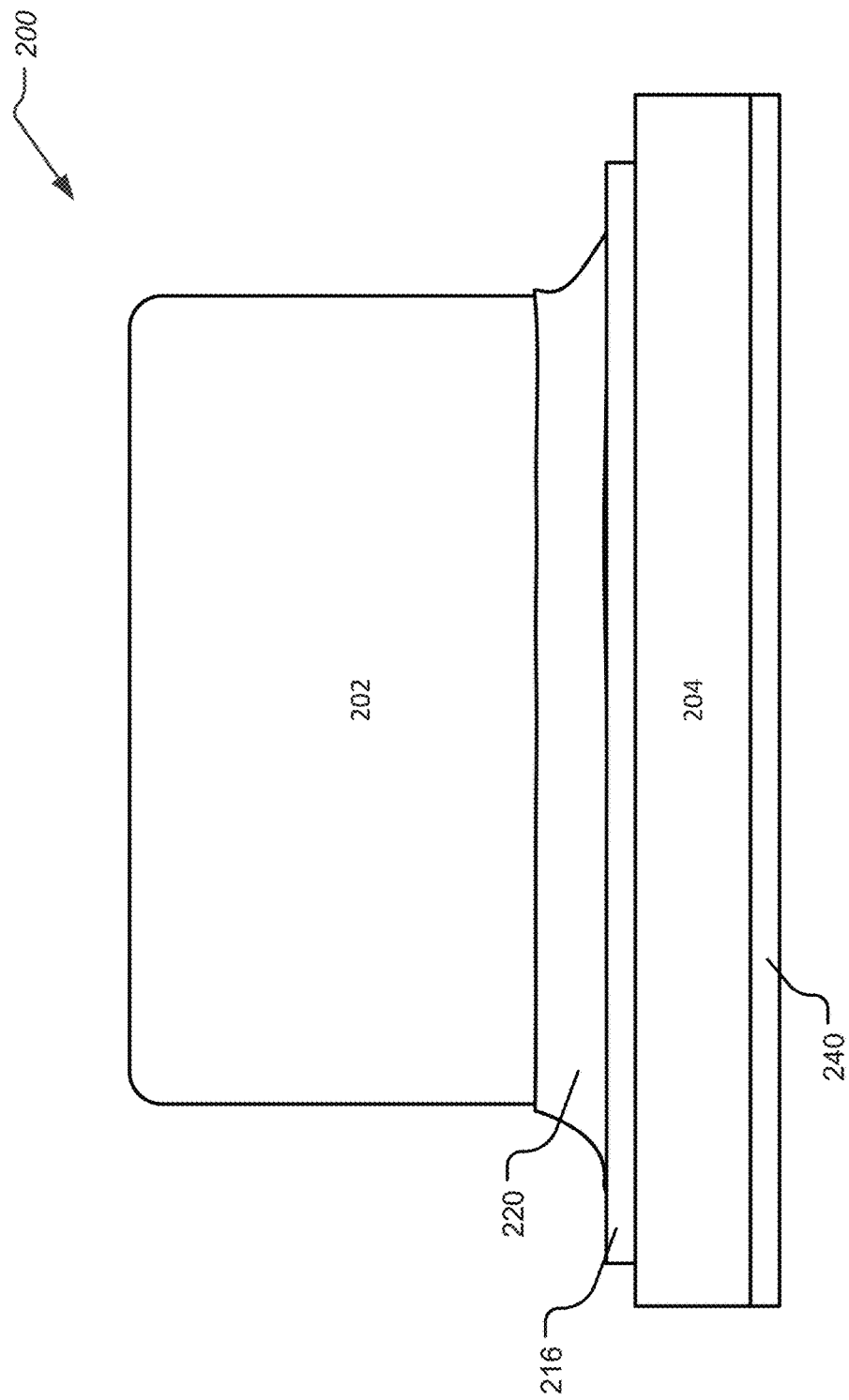
FIG. 15 illustrates an end view of a device carrier according to FIG. 14.

FIG. 15 illustrates an end view of a device carrier according to FIG. 14.

Figure 16:
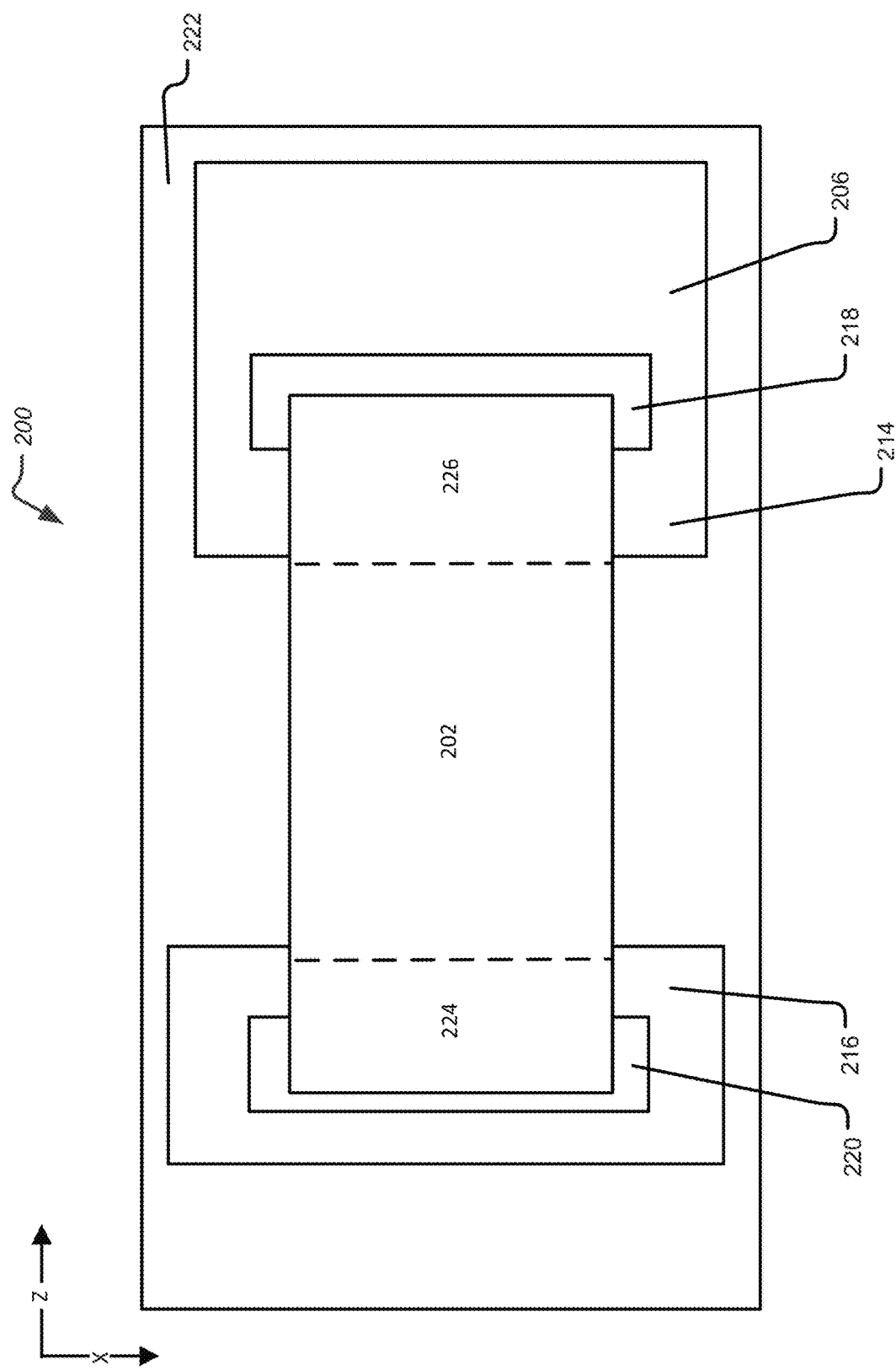
FIG. 16 illustrates a top view of a device carrier according to FIG. 14.

FIG. 16 illustrates a top view of a device carrier according to FIG. 14.

In particular, FIG. 14, FIG. 15, and FIG. 16 illustrate the at least one surface mount device carrier 200 that may include any and all features, configurations, arrangements, implementations, aspects and/or the like as described herein. Additionally, FIG. 14, FIG. 15, and FIG. 16 illustrate that the at least one surface mount device carrier 200 may be implemented with a slimmer configuration with respect to the x-axis. Accordingly, the FIG. 14, FIG. 15, and FIG. 16 aspect may not include the first bond pad area 208 and the third bond pad area 212.

Figure 17:
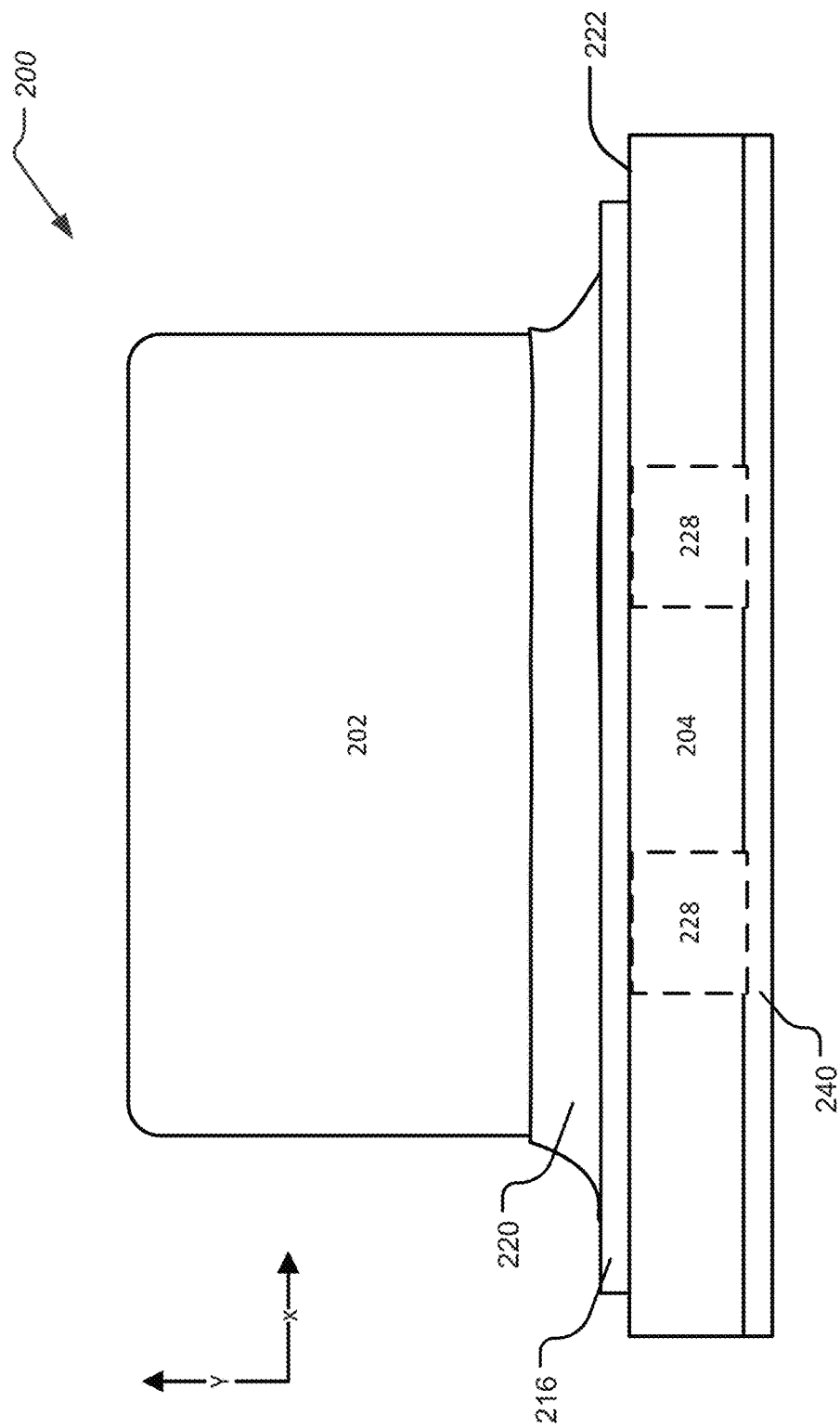
FIG. 17 illustrates an end view of a device carrier according to FIG. 14.

FIG. 17 illustrates an end view of a device carrier according to FIG. 14.

Figure 18:
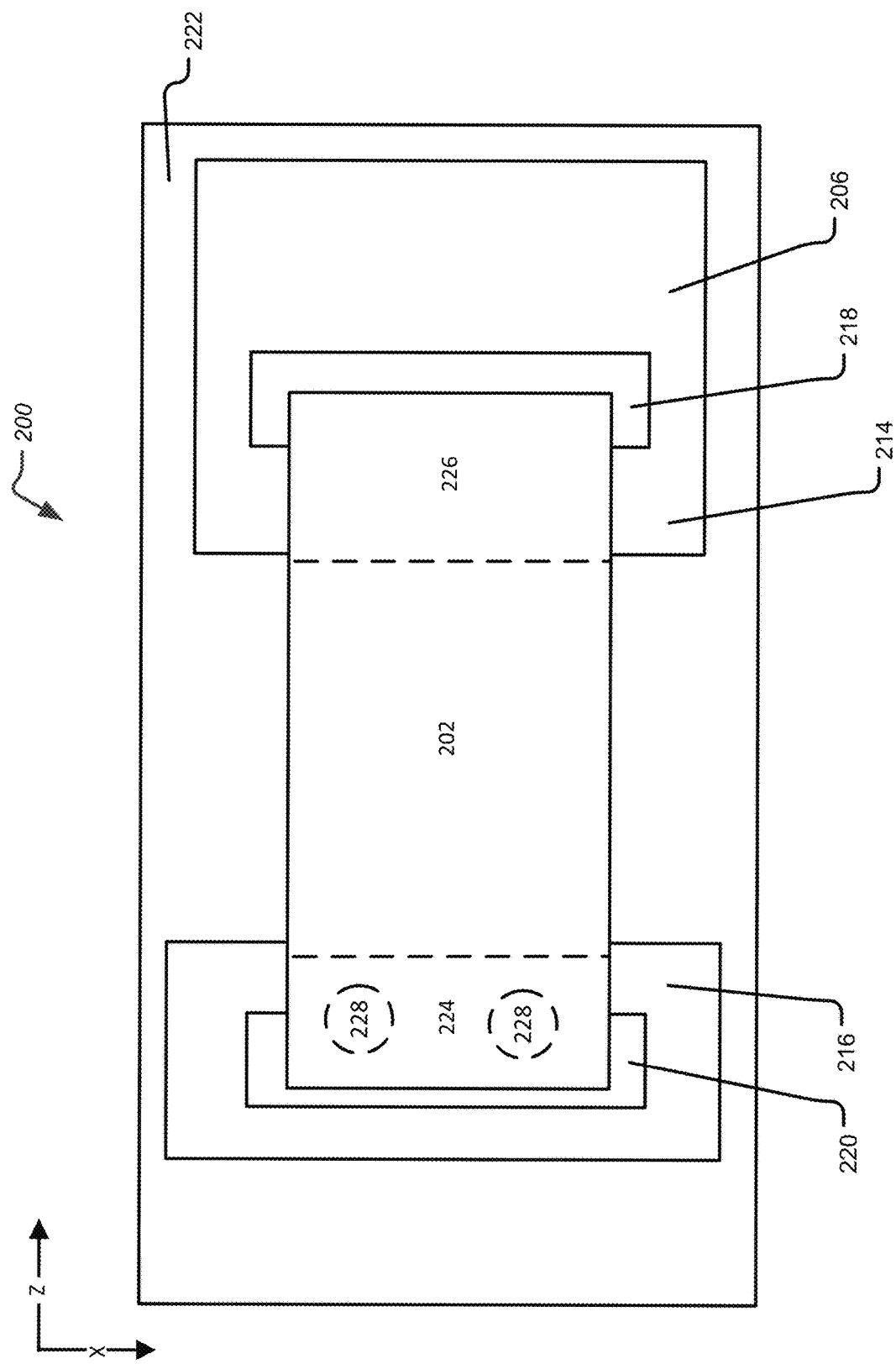
FIG. 18 illustrates a top view of a device carrier according to FIG. 17.

FIG. 18 illustrates a top view of a device carrier according to FIG. 17.

In particular, FIG. 17 and FIG. 18 illustrate the at least one surface mount device carrier 200 that may include any and all features, configurations, arrangements, implementations, aspects and/or the like as described herein. Additionally, FIG. 17 and FIG. 18 illustrate that the at least one surface mount device carrier 200 may include vias 228 as described with reference to FIG. 10 and FIG. 11.

Figure 19:
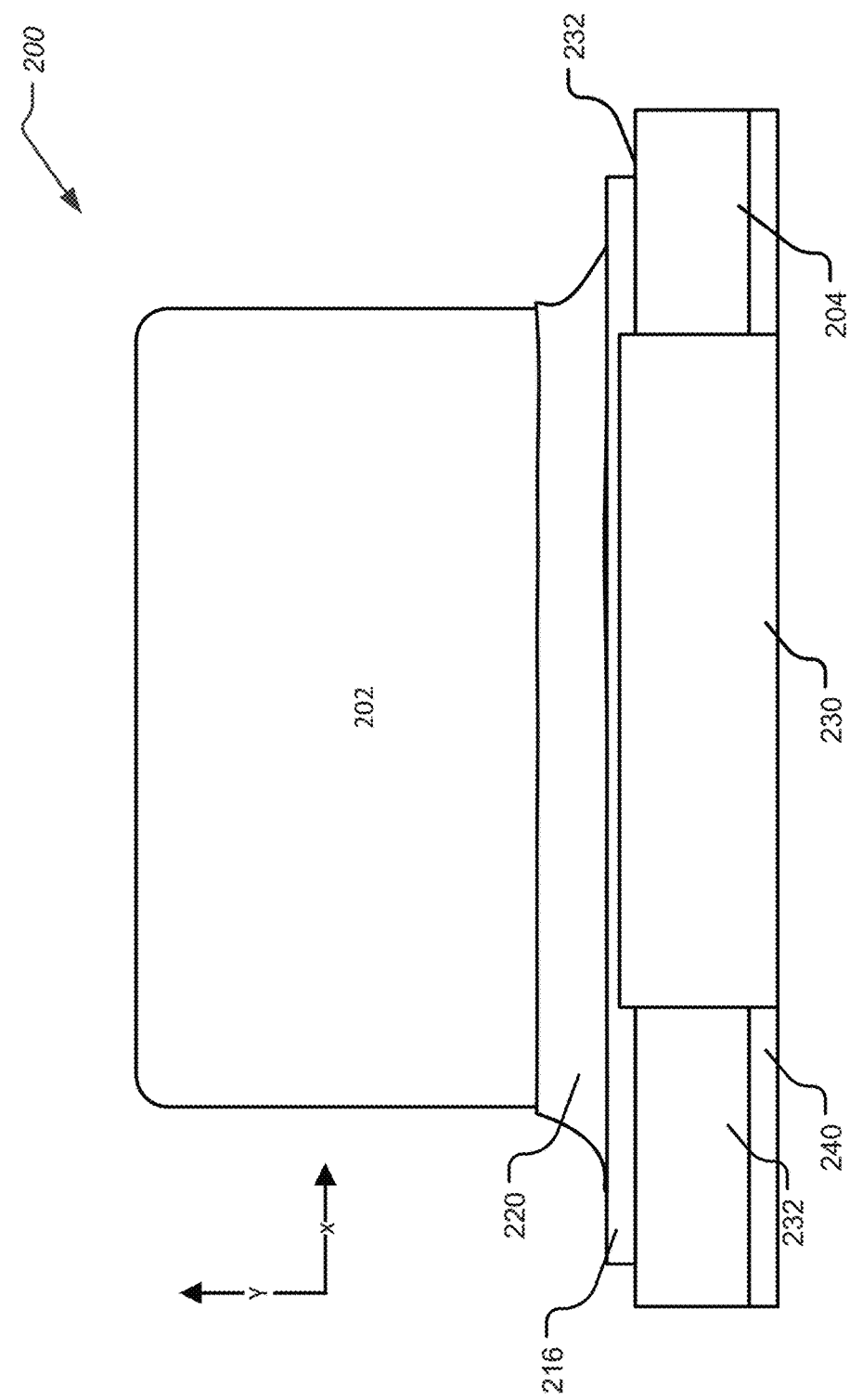
FIG. 19 illustrates an end view of a device carrier according to FIG. 14.

FIG. 19 illustrates an end view of a device carrier according to FIG. 14.

Figure 20:
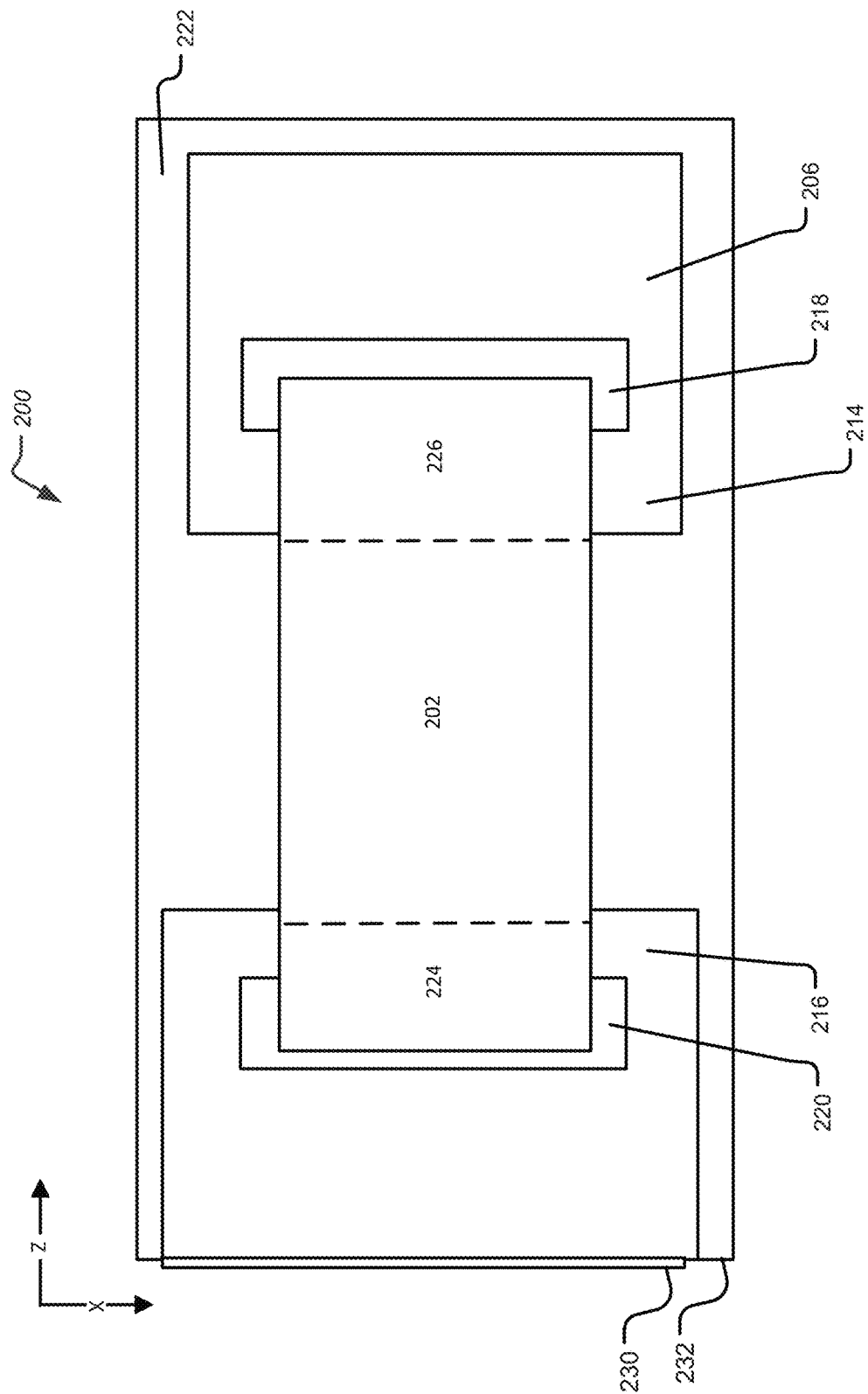
FIG. 20 illustrates a top view of a device carrier according to FIG. 19.

FIG. 20 illustrates a top view of a device carrier according to FIG. 20.

In particular, FIG. 19 and FIG. 20 illustrate the at least one surface mount device carrier 200 that may include any and all features, configurations, arrangements, implementations, aspects and/or the like as described herein. Additionally, FIG. 19 and FIG. 20 illustrate that the at least one surface mount device carrier 200 may include the edge plating 230 as described with reference to FIG. 12 and FIG. 13.

Figure 21:
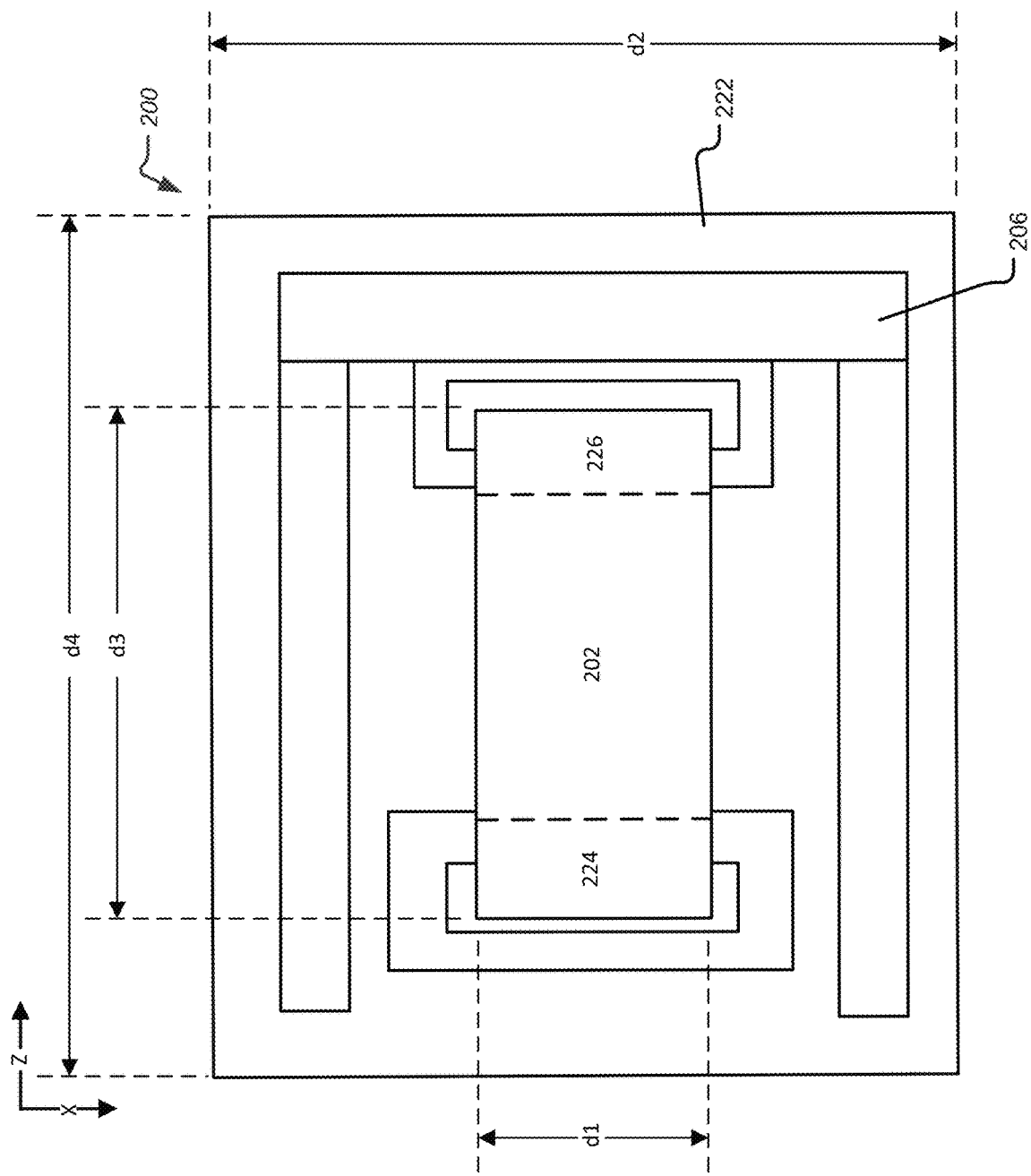
FIG. 21 illustrates a top view of a device carrier according to FIG. 7.

FIG. 21 illustrates a top view of a device carrier according to FIG. 7.

In particular, FIG. 21 illustrates the at least one surface mount device carrier 200 that may include any and all features, configurations, arrangements, implementations, aspects and/or the like as described herein. Additionally, FIG. 21 illustrates exemplary dimensions of the at least one surface mount device carrier 200 and the at least one device 202. A width of the at least one device 202 may be defined as a depth d1. The depth d1 may be taken along a line generally parallel to the x-axis. Moreover, the depth d1 may be defined as a percentage of a length or a depth d2 of the at least one surface mount device carrier 200 along a line generally parallel to the x-axis. In aspects, the depth d1 may be 10%-70% of the depth d2, 10%-20% of the depth d2, 20%-30% of the depth d2, 30%-40% of the depth d2, 40%-50% of the depth d2, 50%-60% of the depth d2, or 60%-70% of the depth d2.

A length of the at least one device 202 may be defined as a depth d3. The depth d3 may be taken along a line generally parallel to the z-axis. Moreover, the depth d3 may be defined as a percentage of a length or a depth d4 of the at least one surface mount device carrier 200 along a line generally parallel to the z-axis. In aspects, the depth d3 may be 20%-90% of the depth d4, 20%-30% of the depth d4, 30%-40% of the depth d4, 40%-50% of the depth d4, 50%-60% of the depth d4, 60%-70% of the depth d4, 70%-80% of the depth d4, or 80%-90% of the depth d4.

Figure 22:
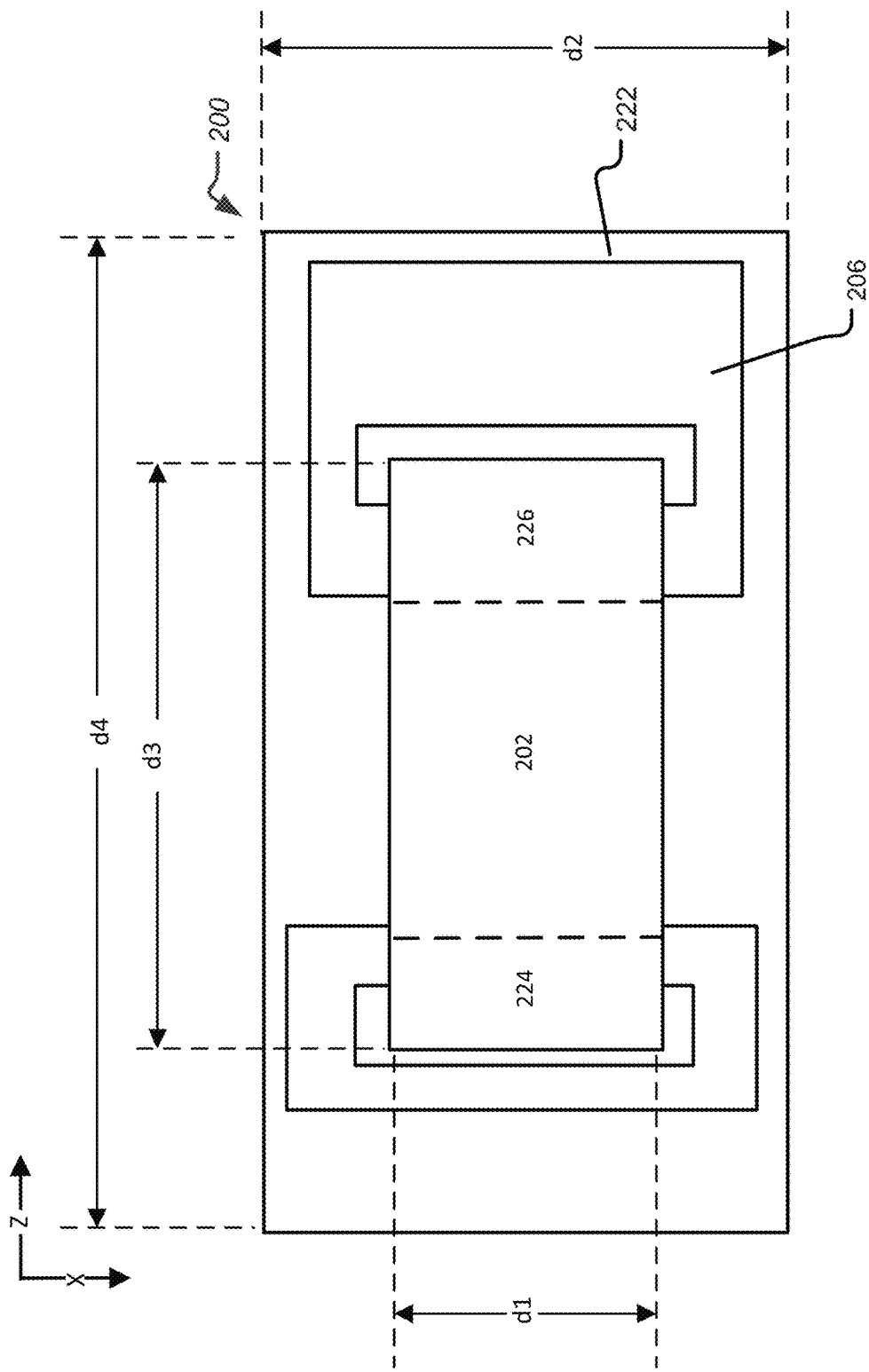
FIG. 22 illustrates a top view of a device carrier according to FIG. 14.

FIG. 22 illustrates a top view of a device carrier according to FIG. 14.

In particular, FIG. 22 illustrates the at least one surface mount device carrier 200 that may include any and all features, configurations, arrangements, implementations, aspects and/or the like as described herein. Additionally, FIG. 22 illustrates exemplary dimensions of the at least one surface mount device carrier 200 and the at least one device 202. A width of the at least one device 202 may be defined as a depth d1 The depth d1 may be taken along a line generally parallel to the x-axis. Moreover, the depth d1 may be defined as a percentage of a length or a depth d2 of the at least one surface mount device carrier 200 along a line generally parallel to the x-axis. In aspects, the depth d1 may be 10%-70% of the depth d2, 10%-20% of the depth d2, 20%-30% of the depth d2, 30%-40% of the depth d2, 40%-50% of the depth d2, 50%-60% of the depth d2, or 60%-70% of the depth d2.

A length of the at least one device 202 may be defined as a depth d3. The depth d3 may be taken along a line generally parallel to the z-axis. Moreover, the depth d3 may be defined as a percentage of a length or a depth d4 of the at least one surface mount device carrier 200 along a line generally parallel to the z-axis. In aspects, the depth d3 may be 20%-90% of the depth d4, 20%-30% of the depth d4, 30%-40% of the depth d4, 40%-50% of the depth d4, 50% 60% of the depth d4, 60%-70% of the depth d4, 70%-80% of the depth d4, or 80%-90% of the depth d4. In aspects, the dimensions of d1, d2, d3, and/or d4 of the at least one surface mount device carrier 200 as described herein with reference to FIG. 21 and FIG. 22 may be critical to ensure close proximity to the at least one secondary device 300 and/or other components of the package 100 to ensure higher performance of the package 100 and the like.

Figure 23:
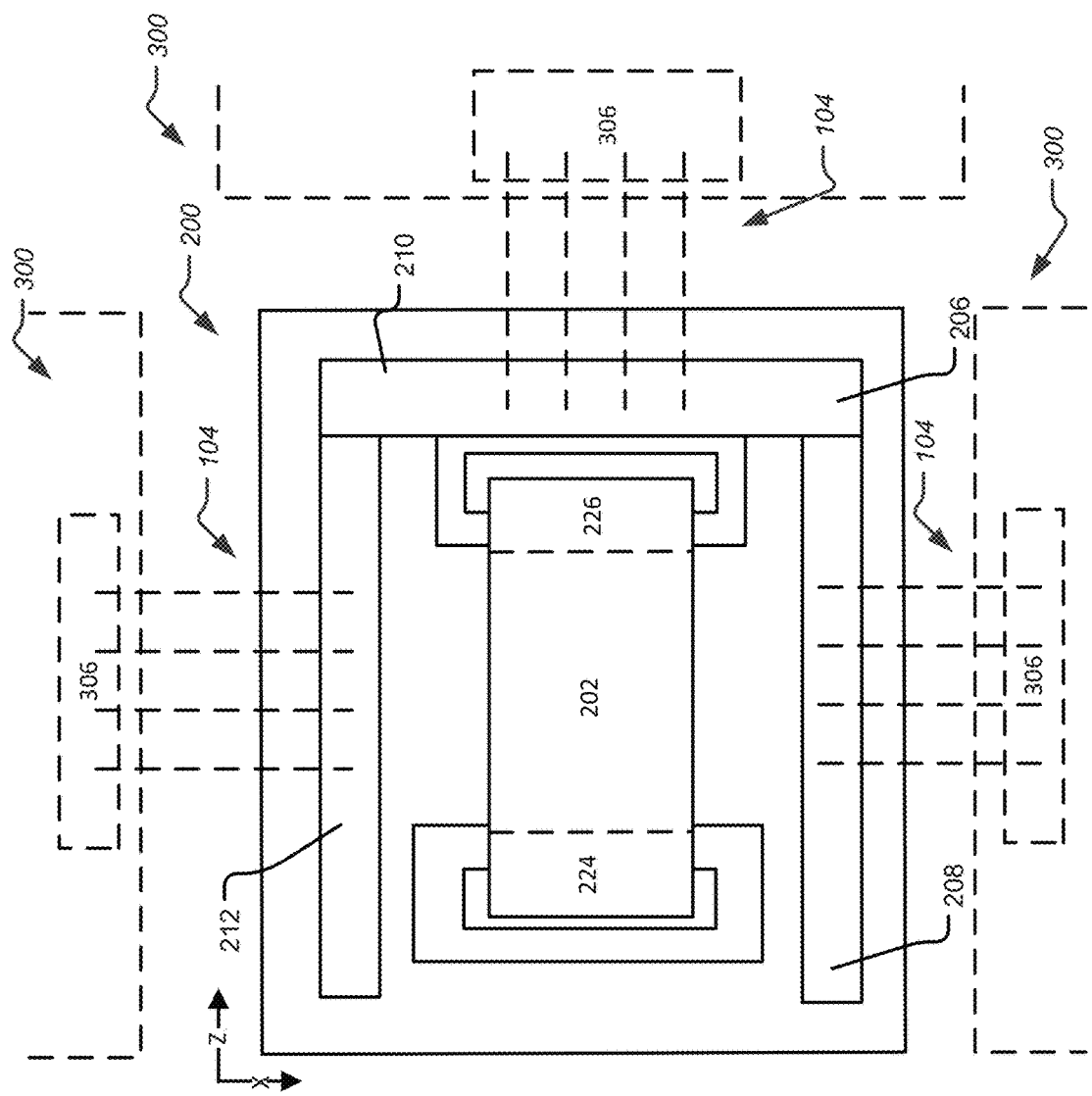
FIG. 23 illustrates a top view of a device carrier according to FIG. 7.

FIG. 23 illustrates a top view of a device carrier according to FIG. 7.

In particular, FIG. 23 illustrates various possible arrangements and configurations of the at least one surface mount device carrier 200, the at least one secondary device 300, and/or the one or more interconnects 104. As illustrated in FIG. 23, the at least one secondary device 300 may be arranged on one side of the at least one surface mount device carrier 200 and the one or more interconnects 104 may connect to the second bond pad area 210; the at least one secondary device 300 may be arranged on another side of the at least one surface mount device carrier 200 and the one or more interconnects 104 may connect to the third bond pad area 212; and/or the at least one secondary device 300 may be arranged on another side of the at least one surface mount device carrier 200 and the one or more interconnects 104 may connect to the first bond pad area 208.

Figure 24:
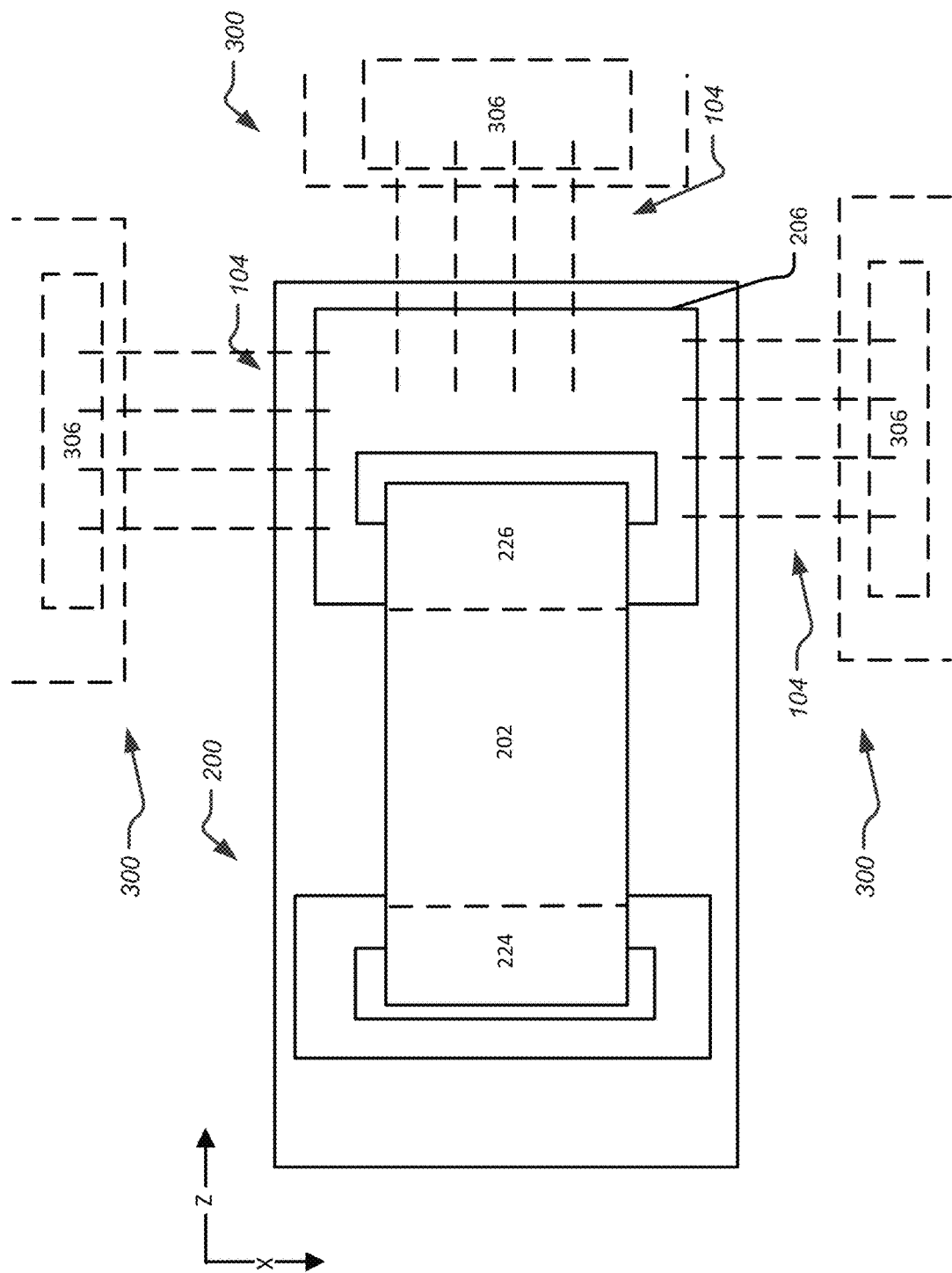
FIG. 24 illustrates a top view of a device carrier according to FIG. 14.

FIG. 24 illustrates a top view of a device carrier according to FIG. 14.

In particular, FIG. 24 illustrates various possible arrangements and configurations of the at least one surface mount device carrier 200, the at least one secondary device 300, and/or the one or ore interconnects 104. As illustrated in FIG. 24, the at least one secondary device 300 may be arranged on one side of the at least one surface mount device carrier 200 and the one or more interconnects 104 may connect to the interconnect pad 206; the at least one secondary device 300 may be arranged on another side of the at least one surface mount device carrier 200 and the one or more interconnects 104 may connect to the interconnect pad 206; and/or the at least one secondary device 300 may be arranged on another side of the at least one surface mount device carrier 200 and the one or more interconnects 104 may connect to the interconnect pad 206.

Figure 25:
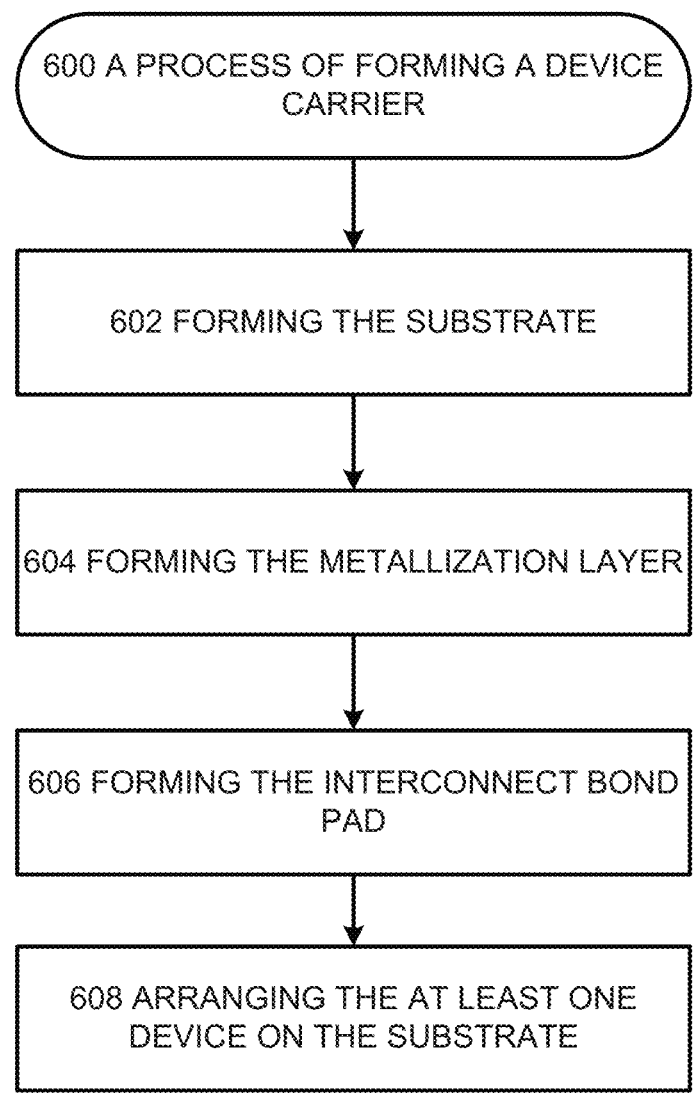
FIG. 25 shows a process of making a device carrier according to the disclosure.

FIG. 25 shows a process of making a device carrier according to the disclosure.

Figure 26:
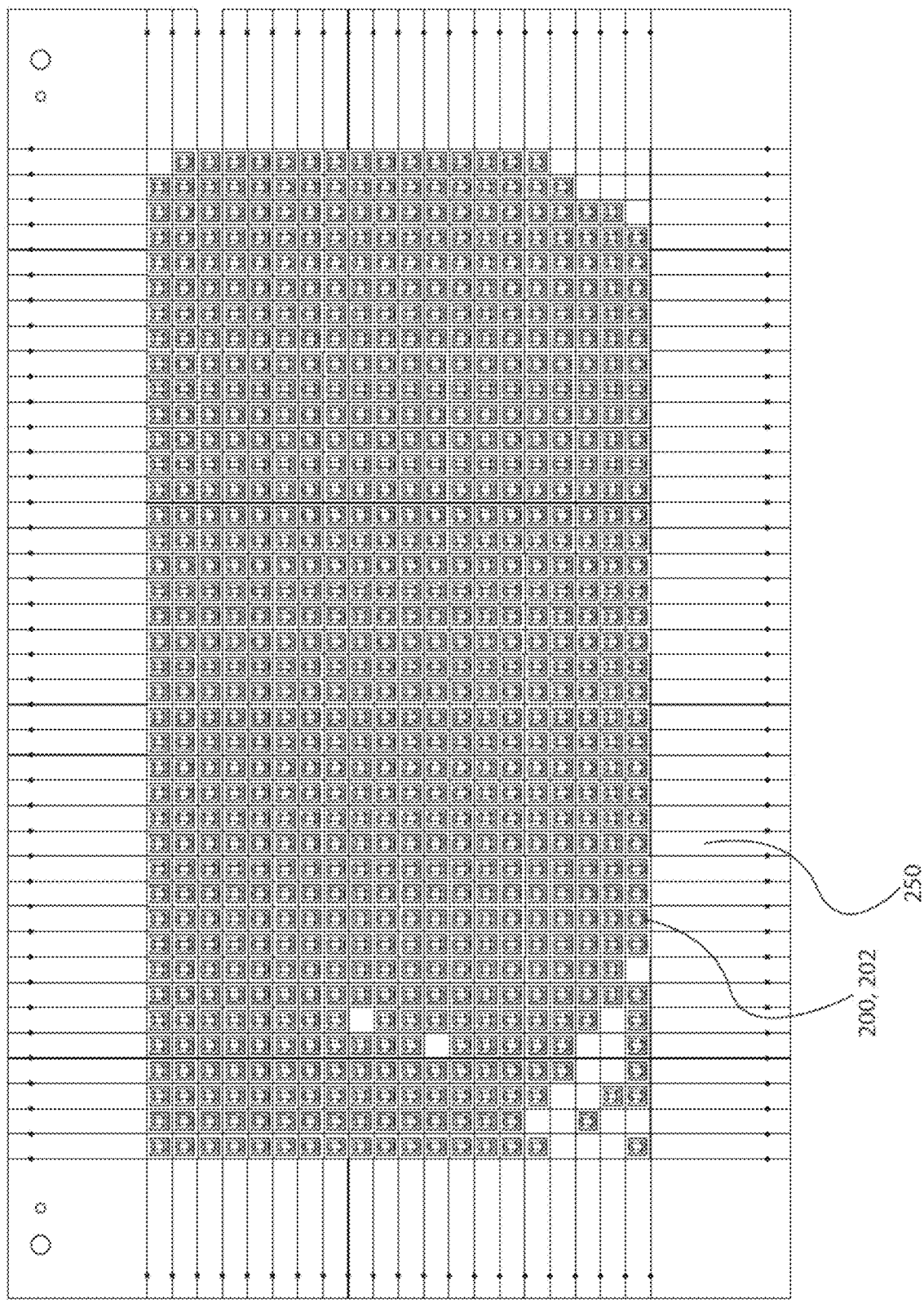
FIG. 26 illustrates a top side view of a panel of device carriers according to the disclosure.

FIG. 26 illustrates a top side view of a panel of device carriers according to the disclosure.

Figure 27:
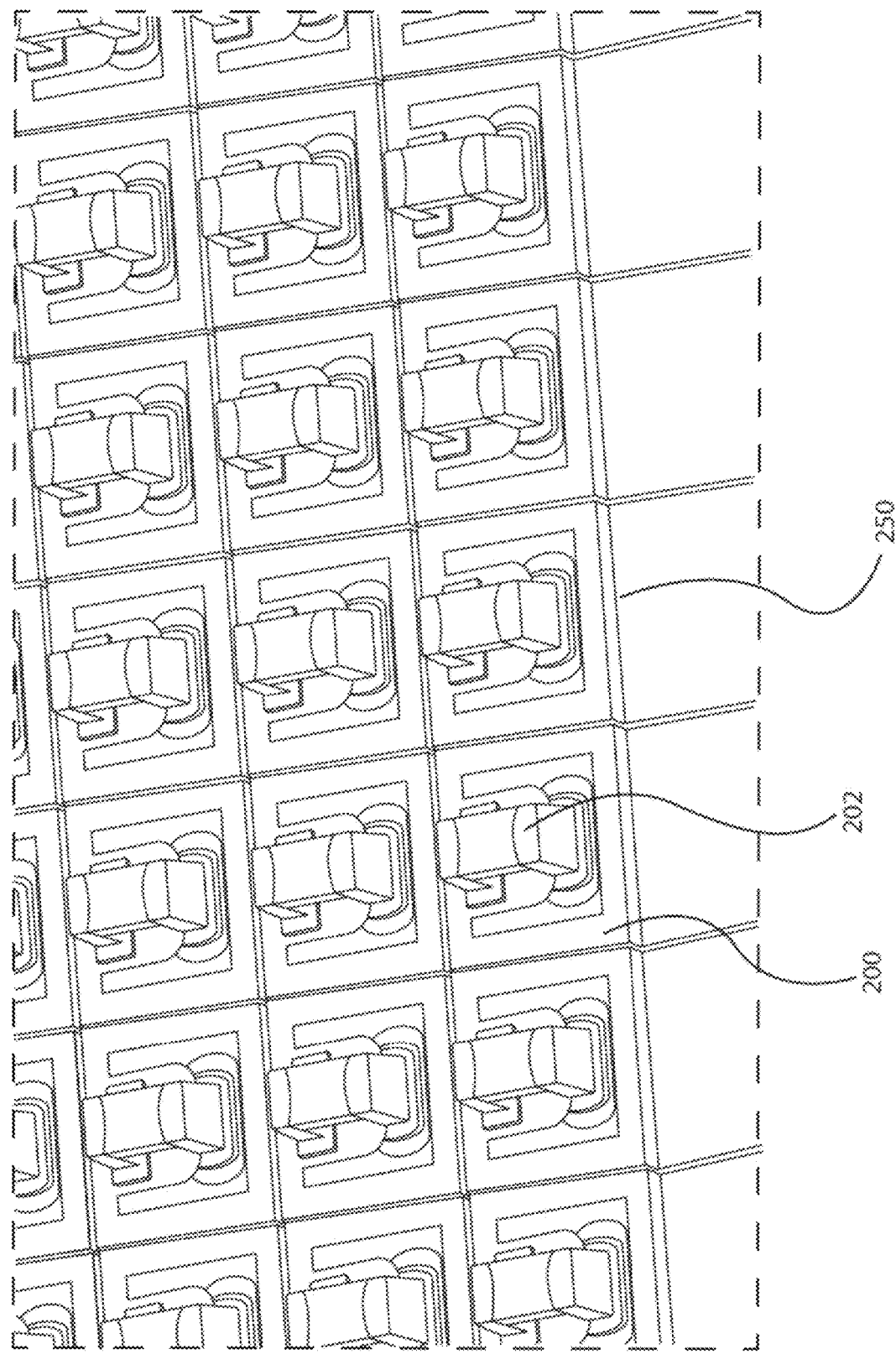
FIG. 27 illustrates a perspective view of a panel of device carriers according to FIG. 26.

FIG. 27 illustrates a perspective view of a panel of device carriers according to FIG. 26.

In particular, FIG. 25 illustrates a process of forming a device carrier 600 that relates to the surface mount device carrier 200 as described herein. It should be noted that the aspects of the process of forming a device carrier 600 may be performed in a different order consistent with the aspects described herein. Additionally, it should be noted that portions of the process of forming a device carrier 600 may be performed in a different order consistent with the aspects described herein. Moreover, the process of forming a device carrier 600 may be modified to have more or fewer processes consistent with the various aspects disclosed herein.

Initially, the process of forming a device carrier 600 may include a process of forming the substrate 602. More specifically, the substrate 204 may be constructed, configured, and/or arranged as described herein. The process of forming the substrate 602 may include forming the substrate 204 as a printed circuit board (PCB) component, a ceramic component, a glass component, a low temperature co-fired ceramic (LTCC) component, a high temperature co-fired ceramic (HTCC) component, a thick film substrate component, and/or the like. In one aspect, the process of forming the substrate 602 may include forming the substrate 204 as a printed circuit board (PCB) component utilizing printed circuit board (PCB) manufacturing processes.

Further, the process of forming a device carrier 600 may include forming the metallization layer 604. More specifically, the metallization layer 240 may be constructed, configured, and/or arranged as described herein on at least a portion of the substrate 204. The process of forming the metallization layer 604 may include utilizing one or more manufacturing techniques including print screening for solder past, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the process of forming a device carrier 600 may include forming the interconnect pad 606. More specifically, the interconnect pad 206 may be constructed, configured, and/or arranged as described herein on the substrate 204. The process of forming the interconnect pad 606 may include utilizing one or more manufacturing techniques including using print screening for solder past, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the process of forming a device carrier 600 may include arranging the at least one device on the substrate 608. More specifically, the at least one device 202 may be constructed, configured, and/or arranged as described herein on the substrate 204. In one aspect, the at least one device 202 may be arranged as described herein on the substrate 204 with an adhesive, soldering, sintering, eutectic bonding, ultrasonically welding, and/or the like as described herein.

More specifically, the process of forming a device carrier 600 may include utilizing printed circuit board (PCB) manufacturing to form the at least one surface mount device carrier 200 in a panel 250 as illustrated in FIG. 26 and FIG. 27. The process of forming a device carrier 600 may include implementing a pick and place assembly to place the at least one device 202 on the at least one surface mount device carrier 200 of the panel 250. The process of forming a device carrier 600 may include implementing a reflow process with the panel 250. The process of forming a device carrier 600 may include cutting the panel 250 utilizing cutting equipment such as wafer, PCB, or package sawing equipment to singulate the at least one surface mount device carrier 200 from the panel 250, which may have the advantage that the at least one surface mount device carrier 200 may be arranged on dicing tape on a ring frame, which can be directly loaded to the Die Attach equipment for subsequent assembly into package 100.

Figure 28:
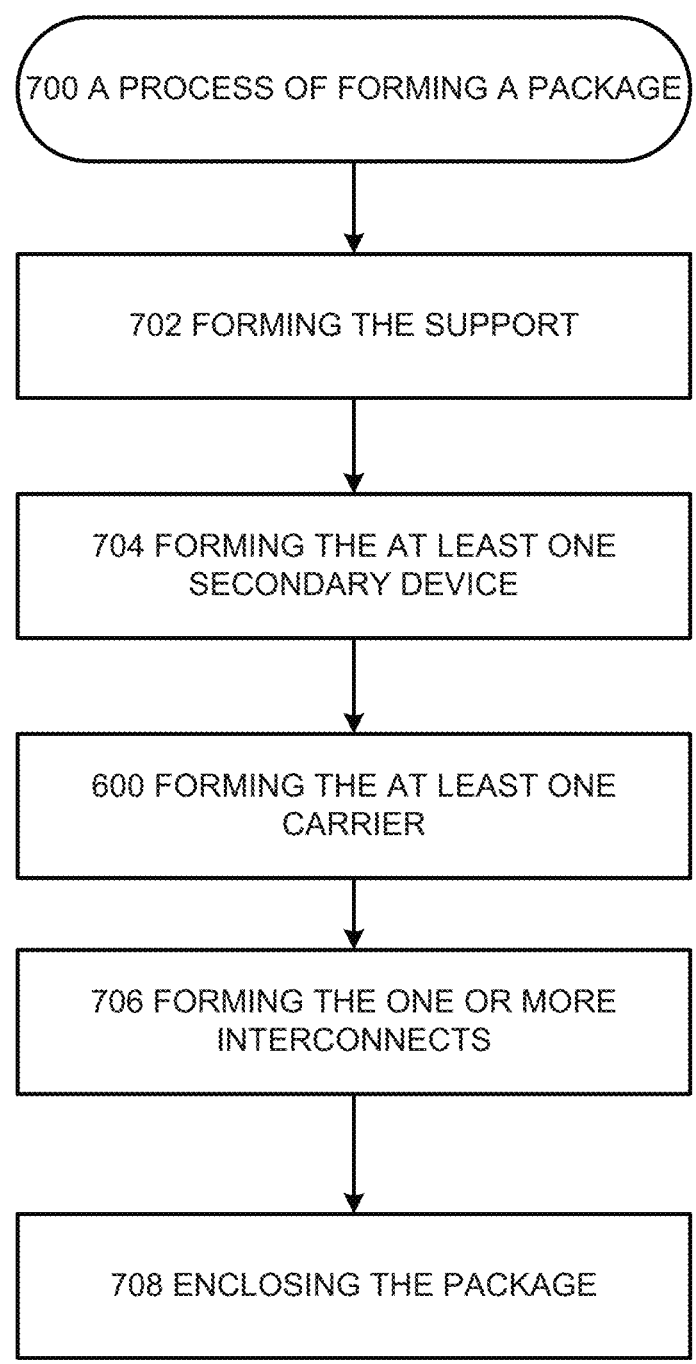
FIG. 28 shows a process of making a package according to the disclosure.

FIG. 28 shows a process of making a package according to the disclosure.

In particular, FIG. 28 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include a process of forming the at least one secondary device 704. More specifically, the at least one secondary device 300 may be constructed, configured, and/or arranged as described herein. In one aspect, the process of forming the at least one secondary device 704 may include forming the at least one secondary device 300 as an active device, a passive device, an integrated passive device (IPD), a transistor device, or the like. In one aspect, the process of forming the at least one secondary device 704 may include forming the at least one secondary device 300 as any electrical component for any application. In this regard, the at least one secondary device 300 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like.

The process of forming a package 700 may include a process of forming the device carrier 600. More specifically, the at least one surface mount device carrier 200 may be constructed, configured, and/or arranged as described herein with reference to FIG. 25 and the associated description thereof. Thereafter, the process of forming the device carrier 600 may further include attaching the at least one surface mount device carrier 200 to the support 102. In this regard, the at least one surface mount device carrier 200 and/or the substrate 204 may be mounted on the upper surface 106 of the support 102 by an adhesive, soldering, sintering, eutectic bonding, ultrasonically welding, and/or the like as described herein.

The process of forming a package 700 may include a process of forming the one or more interconnects 706. More specifically, the one or more interconnects 104 may be constructed, configured, and/or arranged as described herein. In one aspect, the process of forming the one or more interconnects 706 may include forming the one or more interconnects 104 by forming one or more wires, leads, vias, edge platings, circuit traces, tracks, and/or the like. In one aspect, the process of forming the one or more interconnects 706 may include connecting the one or more interconnects 706 by an adhesive, soldering, sintering, eutectic bonding, ultrasonic welding, a clip component, and/or the like as described herein.

The process of forming a package 700 may include a process of enclosing the package 700. More specifically, the package 100 may be constructed, configured, and/or arranged as described herein. In one aspect, the process of enclosing the package 700 may include forming an open cavity configuration, an over-mold configuration, or the like.

In one or more aspects, the disclosure provides devices and processes for implementing high-quality factor Q capacitor devices in the ultimate proximity of a transistor to achieve high video bandwidth for power amplifier transistors for example. Silicon based capacitors such as trench capacitors or the like, have been used as they can be attached onto the heat sink right next to the semiconductor transistor die. The disclosure enables use of ceramic surface mount device (SMD) capacitors to be attached inside a package in near proximity to a transistor by using a substrate (e.g., PCB, LTCC, HTCC, ceramic, glass) at which the capacitor is being mounted on prior to Die Attach. In this regard, having a substrate that can be mounted onto a heat sink, not just one or multiple different caps, but also resistors, inductors, and the like may be added on one or multiple substrates. In this regard, silicon-based capacitors may only provide generally around 30 nano Farads (nF) of capacitance, whereas ceramic surface mount device (SMD) capacitors as described in the disclosure may generally provide 10 micro Farads ($\mu$F) of capacitance. Accordingly, the disclosure enables implementing capacitance with a greater value.

Additionally, ceramic surface mount device (SMD) capacitors having both terminals on a bottom surface, may short out when mounted on a metal flange (heat sink). To be able to use such a ceramic capacitor on a heat sink, the disclosure utilizes, for example, a PCB to route one terminal using VIA or edge plating to a bottom of the substrate and keep another terminal isolated from the other and providing a wire bond pad, so the connection to the transistor DIE can be made. In comparison, achieving high-quality factor Q capacitor devices using silicon-based capacitors using trenches or vias to increase high-quality factor Q still only provides capacitance in the nF range versus ceramic capacitors that can achieve capacitance in the μF range. In one aspect, as set forth by the disclosure, a cost-efficient way to implement the disclosure is by using PCB as the substrate material, using standard PCB manufacturing processes to create the little substrate boards where the ceramic capacitors are attached in high volume surface mount device (SMD) lines using print screening or dispensing for solder past or epoxy and pick and place for assembly going through a reflow process in large panels, Additionally, wafer-sawing equipment may be used to singulate these substrates, which also has the advantage that the substrates are already sitting on dicing tape on a ring frame, which can be automatically loaded to the Die Attach equipment for subsequent assembly into packages.

Accordingly, the disclosure has disclosed devices and processes for implementing devices in close proximity to one another to achieve higher performance of an overall package. For example, high-quality factor Q capacitor devices in close proximity to an associated secondary device. Additionally, the disclosure has disclosed devices and processes that can be attached utilizing a carrier device to a heatsink next to and connected to a secondary device such as a semiconductor transistor die. Moreover, the disclosure has disclosed devices and processes to utilize components with greater capabilities, lower costs, and/or like benefits. Moreover, the disclosure has disclosed devices and processes that result in decreased manufacturing costs. Additionally, the disclosure has disclosed devices and processes that can implement various component configurations to reduce package cost, reduce package manufacturing cost, reduce manufacturing complexity, reduce yield loss, and/or the like.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure,

What is claimed is:

1. An RF transistor package, comprising:
    a metal submount;
    a transistor die mounted to said metal submount;
    a surface mount device carrier mounted to said metal submount, said surface mount device carrier comprising an insulating substrate comprising a top surface and a bottom surface and a first pad and a second pad arranged on a top surface of said surface mount device carrier;
    at least one surface mount device comprising a first terminal and a second terminal, said first terminal of said surface mount device mounted to said first pad and said second terminal mounted to said second pad;
    at least one of the first terminal and the second terminal being configured to be isolated from the metal submount by said insulating substrate; and
    at least one wire bond bonded to the at least one of the first pad and the second pad.

2. The RF transistor package according to claim 1 wherein the surface mount device comprises a ceramic capacitor.

3. The RF transistor package according to claim 1 wherein:
    the transistor die comprises one of the following: an LDMOS transistor die and a GaN based HEMT; and
    the insulating substrate comprises one of the following: a printed circuit board (PCB) component, a ceramic component, a glass component, a low temperature co-fired ceramic (LTCC) component, a high temperature co-fired ceramic (HTCC) component, and a thick film substrate component.

4. The RF transistor package according to claim 1 wherein the RF transistor package comprises a plurality of transistors.

5. The RF transistor package according to claim 4 wherein the plurality of transistors are configured in a Doherty configuration.

6. The RF transistor package according to claim 1 wherein the surface mount device carrier comprises a plurality of surface mount devices mounted to the top surface of said surface mount device carrier.

7. The RF transistor package according to claim 1 wherein the insulating substrate comprises at least one of the following: a via configured to make an electrical connection between the surface mount device and the metal submount or edge plating configured to make an electrical connection between the surface mount device and the metal submount.

8. The RF transistor package according to claim 1 wherein the at least one wire bond is configured to electrically couple the surface mount device to the transistor die.

9. The RF transistor package according to claim 1 wherein the at least one wire bond is configured to electrically couple the surface mount device to an integrated passive device.

10. A device, comprising:
    a surface mount device carrier configured to be mounted to a metal submount of a transistor package, said surface mount device carrier comprising an insulating substrate comprising a top surface and a bottom surface and a first pad and a second pad arranged on a top surface of said surface mount device carrier;
    at least one surface mount device comprising a first terminal and a second terminal, said first terminal of said surface mount device mounted to said first pad and said second terminal mounted to said second pad; and
    at least one of the first terminal and the second terminal being configured to be isolated from the metal submount by said insulating substrate,
    wherein at least one of the first pad and the second pad are configured as wire bond pads.

11. The device according to claim 10 wherein the surface mount device comprises a ceramic capacitor.

12. The device according to claim 10 wherein:
    the surface mount device carrier is configured to be implemented in an RF transistor package that comprises one of the following: an LDMOS transistor die and a GaN based HEMT; and
    the insulating substrate comprises one of the following: a printed circuit board (PCB) component, a ceramic component, a glass component, a low temperature co-fired ceramic (LTCC) component, a high temperature co-fired ceramic (HTCC) component, and a thick film substrate component.

13. The device according to claim 10 wherein the surface mount device carrier is configured to be implemented in an RF transistor package that comprises a plurality of transistors.

14. The device according to claim 13 wherein the plurality of transistors are configured in a Doherty configuration.

15. The device according to claim 10 wherein the surface mount device carrier comprises a plurality of surface mount devices mounted to the top surface of said surface mount device carrier.

16. The device according to claim 10 wherein the insulating substrate comprises at least one of the following: a via configured to make an electrical connection between the surface mount device and the metal submount or edge plating configured to make an electrical connection between the surface mount device and the metal submount.

17. The device according to claim 10 wherein at least one wire bond is configured to electrically couple the surface mount device to a die implemented in an RF transistor package.

18. The device according to claim 10 wherein at least one wire bond is configured to electrically couple the surface mount device to an integrated passive device.

19. A process for implementing an RF transistor package, comprising,
providing a metal submount;
mounting a transistor die to said metal submount;
mounting a surface mount device carrier to said metal submount, said surface mount device carrier comprising an insulating substrate comprising a top surface and a bottom surface and a first pad and a second pad arranged on a top surface of said surface mount device carrier;
providing a first terminal and a second terminal on a surface mount device;
mounting said first terminal of said surface mount device to said first pad and said second terminal of said surface mount device to said second pad;
configuring at least one of the first terminal and the second terminal to be isolated from the metal submount by said insulating substrate; and
bonding at least one wire bond to the at least one of the first pad and the second pad.

20. The process for implementing an RF transistor package according to claim 19 wherein the surface mount device comprises a ceramic capacitor.

21. The process for implementing an RF transistor package according to claim 19 further comprising configuring the insulating substrate as one of the following: a printed circuit board (PCB) component, a ceramic component, a glass component, a low temperature co-fired ceramic (LTCC) component, a high temperature co-fired ceramic (HTCC) component, and a thick film substrate component,
wherein the transistor die comprises one of the following: an LDMOS transistor die and a GaN based HEMT.

22. The process for implementing an RF transistor package according to claim 19 further comprising implementing a plurality of transistors.

23. The process for implementing an RF transistor package according to claim 22 further comprising implementing the plurality of transistors in a Doherty configuration.

24. The process for implementing an RF transistor package according to claim 19 further comprising:
implementing the surface mount device carrier with a plurality of surface mount devices; and
mounting the plurality of surface mount devices to the top surface of said surface mount device carrier.

25. The process for implementing an RF transistor package according to claim 19 further comprising configuring the insulating substrate to include at least one of the following: a via to make an electrical connection between the surface mount device and the metal submount or edge plating configured to make an electrical connection between the surface mount device and the metal submount.

26. The process for implementing an RF transistor package according to claim 19 further comprising configuring the at least one wire bond to electrically couple the surface mount device to the transistor die.

27. The process for implementing an RF transistor package according to claim 19 further comprising configuring the at least one wire bond to electrically couple the surface mount device to an integrated passive device.

* * * * *